United States Patent
Joo

(10) Patent No.: US 11,052,636 B2
(45) Date of Patent: Jul. 6, 2021

(54) FUSED SHEET FOR ELECTROMAGNETIC WAVE ABSORPTION-EXTINCTION AND SHIELDING, AND FOR ELECTRONIC EQUIPMENT HIGH HEAT DISSIPATION, AND METHOD OF MANUFACTURING THE SAME

(71) Applicant: Hak Sik Joo, Seoul (KR)

(72) Inventor: Hak Sik Joo, Seoul (KR)

( * ) Notice: Subject to any disclaimer, the term of this patent is extended or adjusted under 35 U.S.C. 154(b) by 408 days.

(21) Appl. No.: 15/317,154

(22) PCT Filed: Sep. 6, 2016

(86) PCT No.: PCT/KR2016/009948
§ 371 (c)(1),
(2) Date: Dec. 8, 2016

(87) PCT Pub. No.: WO2017/043831
PCT Pub. Date: Mar. 16, 2017

(65) Prior Publication Data
US 2018/0162098 A1    Jun. 14, 2018

(30) Foreign Application Priority Data

Sep. 7, 2015  (KR) .................. 10-2015-0126085
Sep. 7, 2015  (KR) .................. 10-2015-0126086
(Continued)

(51) Int. Cl.
*B32B 9/04*    (2006.01)
*B32B 15/08*   (2006.01)
(Continued)

(52) U.S. Cl.
CPC ............. *B32B 9/041* (2013.01); *B32B 5/024* (2013.01); *B32B 5/028* (2013.01); *B32B 7/04* (2013.01);
(Continued)

(58) Field of Classification Search
CPC ......... B32B 9/007; B32B 9/041; B32B 15/00; B32B 2305/026; B32B 2305/188;
(Continued)

(56) References Cited

U.S. PATENT DOCUMENTS 4,981,172 A *  1/1991  Haerle .................... B22F 3/002
                                                    165/133
5,509,993 A *  4/1996  Hirschvogel ........... B32B 15/04
                                                    156/326
(Continued)

FOREIGN PATENT DOCUMENTS

CN        103666306        3/2014
CN        103857266        6/2014
(Continued)

OTHER PUBLICATIONS

Aluminum Density, Engineering Toolbox, engineeringtoolbox. com, 2009 (Year: 2009).*
SIPO, Office Action of CN 201680001577.1 dated Jun. 5, 2019.

*Primary Examiner* — Jennifer A Steele
(74) *Attorney, Agent, or Firm* — Lex IP Meister, PLLC

(57) ABSTRACT

The present invention discloses a fused sheet for electromagnetic wave absorption/extinction and shielding, and for electronic equipment high heat dissipation. The fused sheet for electromagnetic wave absorption/extinction and shielding, and for electronic equipment high heat dissipation of the present invention includes a premolded graphite sheet prepared by molding a graphite substrate into a sheet form having a density in a range of 0.1-1.5 g/cm³ and an incomplete state of crystal structure; and a porous metal sheet having a plurality of pores connected to upper and lower surfaces of the porous metal sheet, wherein the premolded graphite sheet is stacked on one surface of the porous metal
(Continued)

sheet, and press molded to be integrally attached and combined, so as to have a density of 1.6 g/cm$^3$-6.0 g/cm$^3$.

14 Claims, 11 Drawing Sheets

(30) Foreign Application Priority Data

| | | |
|---|---|---|
| Oct. 23, 2015 | (KR) | 10-2015-0147750 |
| Oct. 23, 2015 | (KR) | 10-2015-0147751 |
| Jul. 18, 2016 | (KR) | 10-2016-0090511 |
| Jul. 18, 2016 | (KR) | 10-2016-0090512 |

(51) Int. Cl.

| | |
|---|---|
| *B32B 9/00* | (2006.01) |
| *B32B 7/04* | (2019.01) |
| *B32B 27/06* | (2006.01) |
| *B32B 5/02* | (2006.01) |
| *B32B 15/02* | (2006.01) |
| *B32B 15/04* | (2006.01) |
| *B32B 15/20* | (2006.01) |
| *C25D 1/08* | (2006.01) |
| *H05K 9/00* | (2006.01) |
| *H05K 7/20* | (2006.01) |
| *H01L 23/373* | (2006.01) |
| *B32B 27/14* | (2006.01) |
| *B32B 15/16* | (2006.01) |
| *H01L 23/552* | (2006.01) |
| *D03D 15/593* | (2021.01) |
| *B32B 37/10* | (2006.01) |
| *B32B 37/18* | (2006.01) |
| *C25D 1/20* | (2006.01) |
| *D03D 1/00* | (2006.01) |
| *D03D 9/00* | (2006.01) |
| *B22F 3/11* | (2006.01) |

(52) U.S. Cl.
CPC ............... *B32B 9/00* (2013.01); *B32B 9/007* (2013.01); *B32B 9/047* (2013.01); *B32B 9/048* (2013.01); *B32B 15/02* (2013.01); *B32B 15/043* (2013.01); *B32B 15/08* (2013.01); *B32B 15/16* (2013.01); *B32B 15/20* (2013.01); *B32B 27/06* (2013.01); *B32B 27/14* (2013.01); *B32B 37/10* (2013.01); *B32B 37/18* (2013.01); *C25D 1/08* (2013.01); *C25D 1/20* (2013.01); *D03D 1/0058* (2013.01); *D03D 9/00* (2013.01); *D03D 15/593* (2021.01); *H01L 23/373* (2013.01); *H01L 23/3733* (2013.01); *H01L 23/552* (2013.01); *H05K 7/2039* (2013.01); *H05K 7/20472* (2013.01); *H05K 9/0081* (2013.01); *H05K 9/0086* (2013.01); *H05K 9/0088* (2013.01); *B22F 3/11* (2013.01); *B32B 2250/03* (2013.01); *B32B 2250/04* (2013.01); *B32B 2255/06* (2013.01); *B32B 2255/26* (2013.01); *B32B 2260/02* (2013.01); *B32B 2260/021* (2013.01); *B32B 2260/04* (2013.01); *B32B 2260/046* (2013.01); *B32B 2262/103* (2013.01); *B32B 2264/105* (2013.01); *B32B 2264/108* (2013.01); *B32B 2305/026* (2013.01); *B32B 2305/188* (2013.01); *B32B 2305/38* (2013.01); *B32B 2305/80* (2013.01); *B32B 2307/212* (2013.01); *B32B 2307/302* (2013.01); *B32B 2307/51* (2013.01); *B32B 2307/704* (2013.01); *B32B 2307/72* (2013.01); *B32B 2307/732* (2013.01); *B32B 2311/24* (2013.01); *B32B 2313/04* (2013.01); *B32B 2457/00* (2013.01); *B32B 2457/20* (2013.01); *B32B 2457/206* (2013.01); *D10B 2101/20* (2013.01); *D10B 2401/04* (2013.01)

(58) Field of Classification Search
CPC .......... B32B 2305/80; B32B 2307/212; B32B 2307/302; B32B 2313/04; B32B 2457/20; B32B 2305/38; B32B 37/10; B32B 15/08; B32B 9/00; D03D 15/02; D03D 9/00; D03D 1/0058; D10B 2101/20; D10B 2401/04; C25D 1/20; C25D 1/08; H05K 9/0081; H05K 7/2039; H05K 9/0088; H05K 9/0086; B22F 3/11; B22F 3/00; B22F 7/00; B22F 2207/17; H01L 23/373; B82Y 30/00

See application file for complete search history.

(56) References Cited

U.S. PATENT DOCUMENTS

| | | | | |
|---|---|---|---|---|
| 5,672,405 | A | * 9/1997 | Plank, Jr. | B29C 45/14311 |
| | | | | 264/273 |
| 6,096,111 | A | * 8/2000 | Polese | B01D 39/2075 |
| | | | | 257/E23.112 |
| 2005/0150596 | A1 | 7/2005 | Vargo et al. | |
| 2006/0225874 | A1* | 10/2006 | Shives | F28F 21/02 |
| | | | | 165/185 |
| 2011/0038124 | A1* | 2/2011 | Burnham | H01L 23/3737 |
| | | | | 361/717 |
| 2013/0122375 | A1* | 5/2013 | Goto | C25D 1/08 |
| | | | | 429/242 |
| 2014/0116661 | A1 | 5/2014 | Xu et al. | |
| 2015/0173176 | A1 | 6/2015 | Lee | |
| 2017/0216923 | A1* | 8/2017 | Babenko | B01J 35/0006 |

FOREIGN PATENT DOCUMENTS

| | | | | |
|---|---|---|---|---|
| CN | 104883381 | | 9/2015 | |
| EP | 2763520 | | 8/2014 | |
| JP | H0797602 | * | 4/1995 | |
| JP | 2005-159313 | | 6/2005 | |
| JP | 2005-229100 | | 8/2005 | |
| JP | 2005229100 | A * | 8/2005 | |
| JP | 2006-298687 | | 11/2006 | |
| JP | 2011-042873 | | 3/2011 | |
| JP | 2015-156490 | | 8/2015 | |
| KR | 10-2007-0079891 | | 8/2007 | |
| KR | 10-2012-0073792 | | 7/2012 | |
| KR | 10-1280681 | | 7/2013 | |
| WO | WO-2013180662 A1 | * | 12/2013 | ............. H01G 11/48 |
| WO | WO2016016660 | * | 2/2016 | ............. B01J 21/18 |

\* cited by examiner

FUSED SHEET FOR ELECTROMAGNETIC WAVE ABSORPTION-EXTINCTION AND SHIELDING, AND FOR ELECTRONIC EQUIPMENT HIGH HEAT DISSIPATION, AND METHOD OF MANUFACTURING THE SAME

TECHNICAL FIELD

The present invention relates to a fused sheet for being applied to electronic equipment such as a mobile phone, an OLED TV and a LED to allow stable electromagnetic wave absorption/extinction and shielding, and also to secure an excellent heat dissipation property of the electronic equipment, and a method of manufacturing the same. More particularly, the present invention relates to a fused sheet for electromagnetic wave absorption/extinction and shielding, and for electronic equipment high heat dissipation, for securing economical and highly efficient electromagnetic absorption/extinction, and a heat dissipation property, by press molding a graphite substrate to prepare a premolded graphite sheet having an incomplete state of crystal structure, and adhering and pressing a porous metal sheet having pores formed by sintering, electrolysis casting or the like to one surface of the graphite sheet to be integrally combined and molded.

BACKGROUND ART

Recently, as various high-tech electronic equipment such as home appliances conjunctively operated with wired/wireless communication networks including high performance portable wireless information terminals is rapidly increasingly supplied, electromagnetic wave sources, and a need for heat dissipation of equipment are increasing, due to the trend of higher integration and frequency broadening of the electronic elements used in this equipment. That is, as various electronic equipment or devices controlled by the electronic equipment including a refrigerator, a boiler, surveillance and the like conjunctively operated with wired/wireless communication networks including wireless information terminals such as high performance smartphones and tablets are rapidly increasingly supplied, electromagnetic wave sources are increasing, due to the trend of higher integration and frequency broadening of the electronic elements used in this equipment.

Meanwhile, electromagnetic waves refer to a phenomenon in which electromagnetic fields having a periodically changing intensity are propagated through a space, and not only the frequency and wavelength but also the electromagnetic properties thereof are varied. Thus, electromagnetic waves are used in various fields and uses such as various electric/electronic equipment or communication devices. The influence of these electromagnetic waves on a human body may be recognized from various symptoms of which the cause was proved to be electromagnetic waves, such as a thermal effect by microwaves used in a microwave oven, a mobile phone or the like, or a VDT (video display terminal) syndrome which refers to a symptom such as a headache and a visual impairment caused by harmful electromagnetic waves emitted from a computer, a monitor or the like, and further, numerous research results such as an increased cancer incidence of residents near transmission lines, and brain tumor occurrence of mobile phone long-term users have been reported.

Particularly, due to development of a mobile communication technology and popularization of personal mobile communication, users are exposed without protection to high frequency electromagnetic waves generated by a mobile communication device such as a mobile phone, and the possibility of having detrimental effects on a human body such as increased body temperature of a skull area during the use of this mobile communication device is continued to be researched and presented as a problem. These electromagnetic waves may have harmfulness to a human body, and also may be a cause of device failure even to electric/electronic equipment itself by disturbing other electromagnetic waves by electromagnetic interference (EMI). Particularly as the electric/electronic equipment is miniaturized and integrated, there is always a possibility of failure and malfunction by not only external electromagnetic waves but also self-generated electromagnetic waves.

In order to block the effect of electromagnetic waves on the equipment, generally a conductive metal plate (so called, shield can) is attached to a case or main circuit of electric/electronic equipment to form electromagnetic wave shielding means in the form of a metal plate, or an electromagnetic interface (EMI) shielding paint which is an electromagnetic wave shielding paint is applied thereon or dry plating such as vacuum deposition or sputtering is used to shield unnecessary electromagnetic waves.

However, in the case of portable wireless information terminals such as a mobile phone or a smartphone, as they have a display on one surface, the remaining portion except a display panel may be shielded, but the shielded electromagnetic waves may be emitted through the display panel.

At present, as a solution of this problem, two kind of sheets which are a heat dissipation sheet and an EMI sheet have been applied in each company, however, a demand of a functional sheet in a hybrid form obtained by combining two functional sheets into one is expected to explosively increase, for production cost reduction and efficiency in the future. For example, a heat dissipation member was reported to be 421,900 million yen which is increased by 38.3%, and a heat dissipation material was reported to be 3,700 million yen which is increased by 3.4 times as compared with those in 2011, due to an increasing demand of LED which is one of highly exothermic electronic equipment, and various semiconductors, electric/electronic components, and automobile-related components.

In addition, in the case of the mobile solution module (MSM) chip of a mobile phone, the temperature of the chip is greatly raised so that the maximum temperature is above 80° C. when it is operated in a full mode. Since a slim digital device such as a mobile phone does not have enough room to mount a heat sink thereon, it is most effective to lower an average temperature by using a heat diffuser to spread the temperature of a hot spot throughout the entire space. Therefore, technical development for manufacturing a sheet form having a high thermal conductivity in a horizontal direction, while being flexible and having excellent adhesiveness like conventional adhesive films is needed. As confirmed therefrom, technical development for effective electromagnetic wave absorption/extinction and shielding due to the higher performance of electronic equipment is urgently needed.

Further, development of an effective heat dissipation technology due to the higher performance of electronic equipment is also urgently needed. In order to solve this problem, Korean Patent Registration No. 10-0755014 suggests a graphite heat dissipation sheet having a thermally conductive adhesive applied thereon, in which claim 5 recites a graphite heat dissipation sheet having a thermally conductive adhesive applied thereon, including a graphite heat dissipation sheet formed in a sheet form having a thickness of 0.5 to 60 mm; a thermally conductive adhesive applied on one side of the graphite heat dissipation sheet, formed by stirring a silicone adhesive obtained by reacting 25 to 45 wt % of polydimethylsiloxane and 20 to 30 wt % of a silicone resin under an alkali catalyst, with 25 to 55 wt % of a thermally conductive filler; release paper attached on the thermally conductive adhesive; and a thermally conductive adhesive applied on the other side of the graphite heat dissipation sheet, formed by a coating solution prepared by mixing a mixture of 16.6 wt % of methyl methacrylate, 16.6 wt % of methacryloxypropyltrimethoxysilane, 32.2 wt % of isopropyl alcohol, 32.2 wt % of butyl acetate and 0.4 wt % of benzoyl peroxide, with 10 wt % of tetrabutyl titanate and 10 wt % chloroplatinic acid of a 2% ethyl hexanol solution.

The graphite heat dissipation sheet having a thermally conductive adhesive applied thereon according to the conventional art, having the constitution as described above is easily adhered to a display product, and also has improved thermal conductivity by applying a thermally conductive adhesive prepared by mixing polydimethylsiloxane and a silicone resin with a thermally conductive filler on one side of the graphite heat dissipation sheet, and further applying a copolymer coating solution formed by methyl methacrylate-trialkoxysilane on the other side of the graphite heat dissipation sheet, thereby preventing graphite powder from flying.

However, the graphite heat dissipation sheet having a thermally conductive adhesive applied thereon according to the conventional art maintains its shape by forming an adhesive layer and a copolymer coating solution on the outer surface of the graphite layer formed of a sheet prepared by solidifying natural or artificial graphite powder, and has a problem in that the graphite layer easily cracks or has damage by bending deformation or external force, so that heat dissipation performance is deteriorated. Therefore, as the durability of the graphite layer in a state of solidified powder is significantly sensitive to external impact, considerable care is needed to be taken in handling in the course of manufacturing, transportation and storage, and also considerable care should be taken when being attached to electronic equipment, and in particular, mass production in a large area is difficult.

Further, mass production is poor for manufacturing relatively expensive graphite into electronic equipment such as a display for a large area, since it is technically difficult, also should be equipped with an exclusive facility, and thus, economical manufacturing is difficult.

Accordingly, since it was not possible to use the graphite sheet alone, a method of attaching protective layers on both surfaces of the sheet was used, but in this case, heat dissipation properties were reduced due to the physical properties of the protective layer, and the durability is still low.

DISCLOSURE

Technical Problem

The present invention has been made in an effort to provide a fused sheet for electromagnetic wave absorption/extinction and shielding, and for electronic equipment high heat dissipation having advantage of press molding a graphite substrate on one surface of a porous metal sheet formed of a porous metal having excellent thermal conductivity as a base substrate, so that a premolded graphite sheet having an incomplete state of crystal structure is stacked, and in this state, pressing the sheet with high pressure using pressing equipment such as a press or roller, thereby strongly impregnating a portion of the graphite substrate into the pores of the porous metal sheet to be combined, so as to be combined into a physically firmly integrated state without using conventional adhesive resin, binder ash or the like.

Further, the present invention has been made in an effort to provide a fused sheet for electromagnetic wave absorption/extinction and shielding, and for electronic equipment high heat dissipation, based on a technical theory that fine pores of a porous metal sheet absorb electromagnetic waves to convert and extinct thermal energy through diffused reflection.

Further, the present invention has been made in an effort to provide a fused sheet for electromagnetic wave absorption/extinction and shielding, and for electronic equipment high heat dissipation, and a method of manufacturing the same having advantage of integrally attaching a composition or organic/inorganic-based resin including graphite or aluminum-based metal on a surface of a porous metal sheet having pores formed thereon, thereby enabling molding into a porous thin film sheet form having elasticity and durability to be applied to various electronic equipment, and suppressing damage such as cracks due to external force, which leads to a higher product value to the applied product, and production of a large area sheet such as a large display.

Technical Solution

An example embodiment of the present invention provides a fused sheet for electromagnetic wave absorption/extinction and shielding, including: a premolded graphite sheet prepared by molding a graphite substrate into a sheet form having a density in a range of 0.1-1.5 $g/cm^3$ and an incomplete state of crystal structure; and a porous metal sheet having a plurality of pores connected to upper and lower surfaces of the porous metal sheet, wherein the premolded graphite sheet is stacked on one surface of the porous metal sheet, and press molded to be integrally attached and combined, so as to have a density of 1.6 $g/cm^3$-6.0 $g/cm^3$.

In the fused sheet for electromagnetic wave absorption/extinction and shielding, the porous metal sheet may have a pore size of 0.01 mm-0.5 mm, and in the fused sheet for high dissipation, the porous metal sheet may have a plurality of pores having a size of 0.001 mm-0.05 mm.

According to an embodiment of the present invention, the premolded graphite sheet may be prepared by compression molding graphite or graphite powder, using a graphite composition of any one of more of organic-, inorganic- and ceramic-based materials with graphite, or molding any one of mixtures a heat dissipation resin of any one or more of organic-, inorganic- and ceramic-based materials with graphite.

According to another embodiment of the present invention, the porous metal sheet may be a sintered sheet prepared by heating and sintering copper-, tin-, zinc-, aluminum- or stainless-based metal powder having a particle size of 1 μm-200 μm at a temperature lower than a melting temperature by 10-30%, and pressing the metal powder.

According to another embodiment of the present invention, the porous metal sheet may be a metal electrolysis cast sheet prepared by immersing a molding frame formed of a resin vaporized or liquefied at a high temperature in an electrolysis casting solution to be current applied, and then electrodepositing a metal to form an electrodeposited layer, and heating this molding frame to remove the resin.

According to another embodiment of the present invention, the porous metal sheet may be a sheet member prepared by forming pores on a thin plate formed of a copper-, tin-, zinc-, aluminum- or stainless-based metal material by a punching, laser or etching method, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding.

According to another embodiment of the present invention, the porous metal sheet may be a net sheet prepared by weaving weft wires and warp wires formed of a metal material having a circular section so as to be intercrossed to each other.

According to another embodiment of the present invention, a heat dissipation film layer formed of metal and organic/inorganic-based resin, which is integrally attached on the other surface of the porous metal sheet to which the graphite sheet is not attached, by pressing, application or impregnation, and a portion of which is impregnated through the pores formed on the surface of the porous metal sheet into the graphite sheet on the opposite surface of the porous metal sheet, and bound thereto, is further included, in which the heat dissipation film layer is formed by stacking any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by attaching a thin plate of aluminum or aluminum alloy.

Another embodiment of the present invention provides a method of manufacturing a fused sheet for electromagnetic wave absorption/extinction and shielding according to the preferred first exemplary embodiment of the present invention, including: preparing a premolded graphite sheet by molding a graphite substrate into a sheet form having a density in a range of 0.1 g/cm$^3$-1.5 g/cm$^3$ and an incomplete state of crystal structure; performing molding into a porous metal sheet by heating copper-, tin-, zinc-, aluminum- or stainless-based metal powder having a melting temperature of 300° C.-1800° C. and a particle size of 1 μm-200 μm under a condition of a temperature atmosphere lower than the melting temperature by 10-30% for 10 to 300 minutes to obtain a porous sintered body having pores having a size of 0.05 mm-3.0 mm; and forming a fused sheet having a density in a range of 1.6 g/cm$^3$-6.0 g/cm$^3$, and pores having a particle size of 0.01 mm-0.5 mm by stacking the premolded graphite sheet on one surface of the porous metal sheet and performing press molding so that the graphite crystals forming the graphite sheet are impregnated into the pores on a surface of the porous metal sheet to be integrally attached and combined.

Yet another embodiment of the present invention provides a method of manufacturing a fused sheet for electromagnetic wave absorption/extinction and shielding according to the preferred second exemplary embodiment of the present invention, including: preparing a premolded graphite sheet by molding a graphite substrate into a sheet form having a density in a range of 0.1 g/cm$^3$-1.5 g/cm$^3$ and an incomplete state of crystal structure; performing molding into a porous metal sheet by applying a current flow solution on an outer surface of a plate-shaped molding frame formed of a resin vaporized or liquefied at high temperature to form a current flow layer, immersing the current flow layer in an electrolysis casting solution to be current applied, electrodepositing a metal to form an electrodeposited layer, and then heating the molding frame to remove the resin; performing molding into a porous metal sheet by pressing the premolded porous metal sheet 1 to 10 times, so as to have a thickness of 0.01 mm-50 mm; and forming a fused sheet having a density in a range of 1.6 g/cm$^3$-6.0 g/cm$^3$, and pores having a particle size of 0.01 mm-0.5 mm by stacking the premolded graphite sheet on one surface of the porous metal sheet and performing press molding so that graphite crystals forming the graphite sheet are impregnated into the pores on a surface of the porous metal sheet to be integrally attached and combined.

Yet another embodiment of the present invention provides a method of manufacturing a fused sheet for electromagnetic wave absorption/extinction and shielding according to the preferred third exemplary embodiment of the present invention, including: preparing a premolded graphite sheet by molding a graphite substrate into a sheet form having a density in a range of 0.1 g/cm$^3$-1.5 g/cm$^3$ and an incomplete state of crystal structure; performing molding into a porous metal sheet by forming pores on a thin plate formed of a copper-, tin-, zinc-, aluminum- or stainless-based metal material by a punching, laser or etching method to obtain a sheet member, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding; and forming a fused sheet having a density in a range of 1.6 g/cm$^3$-6.0 g/cm$^3$, and pores having a particle size of 0.01 mm-0.5 mm by stacking the premolded graphite sheet on one surface of the porous metal sheet and performing press molding so that the graphite crystals forming the graphite sheet are impregnated into the pores on a surface of the porous metal sheet to be integrally attached and combined.

Yet another embodiment of the present invention provides a method of manufacturing a fused sheet for electromagnetic wave absorption/extinction and shielding according to the preferred fourth exemplary embodiment of the present invention, including: preparing a premolded graphite sheet by molding a graphite substrate into a sheet form having a density in a range of 0.1 g/cm$^3$-1.5 g/cm$^3$ and an incomplete state of crystal structure; performing molding into a net-shaped porous metal sheet by weaving weft wires and warp wires formed of a metal material having a circular section so as to be intercrossed to each other, thereby forming pores between the weft wires and the warp wires; and forming a fused sheet having a density in a range of 1.6 g/cm$^3$-6.0 g/cm$^3$, and pores having a particle size of 0.01 mm-0.5 mm by stacking the premolded graphite sheet on one surface of the porous metal sheet and performing press molding so that the graphite crystals forming the graphite sheet are impregnated into the pores on a surface of the porous metal sheet to be integrally attached and combined.

Yet another embodiment of the present invention provides a method of manufacturing a fused sheet for electronic equipment high heat dissipation according to the preferred first exemplary embodiment of the present invention, including: preparing a premolded graphite sheet by molding a graphite substrate into a sheet form having a density in a range of 0.1 g/cm$^3$-1.5 g/cm$^3$ and an incomplete state of crystal structure; performing molding into a porous metal sheet by heating copper-, tin-, zinc-, aluminum- or stainless-based metal powder having a melting temperature of 300° C.-1800° C. and a particle size of 1 μm-200 μm under a condition of a temperature atmosphere lower than the melting temperature by 10-30% for 10 to 300 minutes to obtain a porous sintered body having pores having a size of 0.001 mm-3.0 mm; and forming a fused sheet having a density in a range of 1.6 g/cm³-6.0 g/cm³, and pores having a particle size of 0.001 mm-0.05 mm by stacking the premolded graphite sheet on one surface of the porous metal sheet and performing press molding so that the graphite crystals forming the graphite sheet are impregnated into the pores on a surface of the porous metal sheet to be integrally attached and combined.

Yet another embodiment of the present invention provides a method of manufacturing a fused sheet for electronic equipment high heat dissipation according to the preferred second exemplary embodiment of the present invention, including: preparing a premolded graphite sheet by molding a graphite substrate into a sheet form having a density in a range of 0.1 g/cm³-1.5 g/cm³ and an incomplete state of crystal structure; performing molding into a premolded porous metal sheet by applying a current flow solution on an outer surface of a plate-shaped molding frame formed of a resin vaporized or liquefied at high temperature to form a current flow layer, immersing the current flow layer in an electrolysis casting solution to be current applied, electrodepositing a metal to form an electrodeposited layer, and then heating the molding frame to remove the resin; performing molding into a porous metal sheet by pressing the premolded porous metal sheet 1 to 10 times, so as to have a thickness of 0.01 mm-50 mm; and forming a fused sheet having a density in a range of 1.6 g/cm³-6.0 g/cm³, and pores having a particle size of 0.001 mm-0.05 mm by stacking the premolded graphite sheet on one surface of the porous metal sheet and performing press molding so that the graphite crystals forming the graphite sheet are impregnated into the pores on a surface of the porous metal sheet to be integrally attached and combined.

Yet another embodiment of the present invention provides a method of manufacturing a fused sheet for electronic equipment high heat dissipation according to the preferred third exemplary embodiment of the present invention, including: preparing a premolded graphite sheet by molding a graphite substrate into a sheet form having a density in a range of 0.1 g/cm³-1.5 g/cm³ and an incomplete state of crystal structure; performing molding into a porous metal sheet by forming pores on a thin plate formed of a copper-, tin-, zinc-, aluminum- or stainless-based metal material by a punching, laser or etching method to obtain a sheet member, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding; and forming a fused sheet having a density in a range of 1.6 g/cm³-6.0 g/cm³, and pores having a particle size of 0.001 mm-0.05 mm by stacking the premolded graphite sheet on one surface of the porous metal sheet and performing press molding so that the graphite crystals forming the graphite sheet are impregnated into the pores on a surface of the porous metal sheet to be integrally attached and combined.

Yet another embodiment of the present invention provides a method of manufacturing a fused sheet for electronic equipment high heat dissipation according to the preferred fourth exemplary embodiment of the present invention, including: preparing a premolded graphite sheet by molding a graphite substrate into a sheet form having a density in a range of 0.1 g/cm³-1.5 g/cm³ and an incomplete state of crystal structure; performing molding into a net-shaped porous metal sheet by weaving weft wires and warp wires formed of a metal material having a circular section so as to be intercrossed to each other, thereby forming pores between the weft wires and the warp wires; and forming a fused sheet having a density in a range of 1.6 g/cm³-6.0 g/cm³, and pores having a particle size of 0.001 mm-0.05 mm by stacking the premolded graphite sheet on one surface of the porous metal sheet and performing press molding so that the graphite crystals forming the graphite sheet are impregnated with the pores on a surface of the porous metal sheet to be integrally attached and combined.

According to an embodiment of the present invention, the method of manufacturing a fused sheet for electronic wave absorption/extinction and shielding, and for electronic equipment high heat dissipation may further include: performing molding into an amorphous metal sheet by heating the porous metal sheet at 500° C.-600° C. for 10-40 minutes to be amorphized, subsequently to the molding of the porous metal sheet; and attaching the premolded graphite sheet to the amorphous metal sheet and performing compression molding.

According to an embodiment of the present invention, the method of manufacturing a fused sheet for electronic wave absorption/extinction and shielding, and for electronic equipment high heat dissipation may further include any one of forming a heat dissipation film layer formed of an organic/inorganic-based resin, by integrally attaching the heat dissipation film layer on the other surface of the porous metal sheet on which the premolded graphite sheet is not attached, by pressing, application or impregnation, so that a portion of the heat dissipation film layer is impregnated through the pores formed on the surface of the porous metal sheet into the graphite sheet on the opposite surface of the porous metal sheet, and produces integral binding force; and forming a heat dissipation film layer provided as a thin plate formed of aluminum or aluminum alloy, by integrally attaching the heat dissipation film layer on the other surface of the porous metal sheet on which the premolded graphite sheet is not attached, by pressing, application or impregnation, so that a portion of the heat dissipation film layer is impregnated into the pores formed on a surface of the porous metal sheet to produce binding force.

Advantageous Effects

The fused sheet for electronic wave absorption/extinction and shielding, and the fused sheet for electronic equipment high heat dissipation according to the present invention may be physically firmly and certainly integrated without using an additional adhesive resin or a binder material, by stacking a premolded graphite substrate having an incomplete state of crystal structure on a porous metal sheet formed of a porous metal as a base substrate and performing pressing with high pressure, to be physically integrally combined with each other, thereby directly attaching and connecting the graphite substrate to the porous metal sheet, and thus, may secure excellent absorption/extinction performance and shielding performance, from which an effect of guaranteeing g highly efficient electromagnetic wave absorption/extinction and shielding following higher performance of electronic equipment may be expected, and also, in the case of being applied to a high heat dissipation electronic equipment, heat dissipation performance to efficiently diffuse heat transferred from a heat source may be secured, and thus, an effect of guaranteeing high heat dissipation performance following higher performance of electronic equipment may be expected.

That is, the premolded graphite sheet having an incomplete state of crystal structure is arranged in a stacked form on the surface of the porous metal sheet which is a porous metal substrate having pores which are micropores formed thereon, and pressed with high pressure using pressing equipment such as a press or roller, thereby physically certainly integrating the premolded graphite sheet and the porous metal sheet without using a conventional adhesive resin, a binder material or the like. Therefore, the manufacturing process is simple, thereby allowing economical supply due to mass production, and particularly, the graphite substrate is impregnated into the pores on the surface of the porous metal sheet by pressing force to maintain a firmly combined state, and thus, separation of the graphite substrate, or partial release of the graphite substrate by external force may be stably inhibited, thereby providing improved durability.

Further, by the fused sheet for electromagnetic absorption/extinction and shielding, and the fused sheet for electronic equipment high heat dissipation, and the method of manufacturing the same according to the present invention, a composition based on an organic-, inorganic- or ceramic-based material or graphite resin or a thin plate formed of aluminum or aluminum alloy is formed on the other surface of the porous metal sheet to which the graphite sheet is not attached in a stacked form, to be integrated, thereby increasing elasticity and durability, and thus, it is possible to apply the fused sheet to various electronic equipment, and also to produce a large area sheet.

Accordingly, the manufacturing process is simple, thereby allowing economical supply due to mass production, and particularly, the graphite substrate is impregnated into the pores on the surface of the porous metal sheet by pressing force to maintain a firmly combined state, and thus, separation of the graphite substrate, or partial release of the graphite substrate by external force may be stably inhibited, thereby providing improved durability Further, the fused sheet for electromagnetic absorption/extinction and shielding, and the fused sheet for electronic equipment high heat dissipation may secure excellent electromagnetic absorption/extinction and shielding performance by stacking liquid heat dissipation resins such as an organic-, inorganic- or ceramic-based material or graphite, or a thin plate formed of aluminum/aluminum alloy on the other surface of the porous metal sheet to which the graphite sheet is not attached, to be integrated.

Further, as the porous metal sheet of the present invention is molded by a metal material, it has good durability to cracks, breakage and the like by external force or bending deformation, and since the pores are impregnated with a liquid heat dissipation resin including graphite, the porous metal sheet may be molded into a porous thin film sheet form having elasticity and durability, thereby being applied to various electronic equipment, and also producing a large area sheet. Therefore, the product to which the sheet is applied may secure optimal performance, resulting in a higher value of the product.

| * Description of Drawing Symbols | |
|---|---|
| 1: Fused sheet | 10: Premolded graphite sheet |
| 20: Porous metal sheet | 20a: Pore |
| 21: Sintered sheet | 22: Electrolysis cast sheet |
| 23: Metal thin plate sheet | 23a: Curved portion |
| 23b: Inclined portion | 24: Net sheet |
| 24a: Warp wire | 24b: Weft wire |
| DeletedTexts | |
| 30: Heat dissipation film layer | 33: Adhesive material |
| 35: Metal thin plate | 40: Insulating material |

MODE FOR INVENTION

Hereinafter, the constitutions and functions of the exemplary embodiments of the fused sheet for electromagnetic wave absorption/extinction and shielding, and the fused sheet for electronic equipment high heat dissipation according to the present invention will be described in detail, referring to the accompanying drawings, however, it should be understood that the present invention is not intended to be limited to specific forms of disclosure, and all modifications, equivalents and alternates included in the spirits and technical scope of the present invention are encompassed.

First, both of the fused sheet for electromagnetic wave absorption/extinction and shielding and the fused sheet for electronic equipment high heat dissipation of the present invention have the same constitutions and are manufactured by the same method, but there is a functional difference by the fact that the pore size is different from each other.

Figure 1:
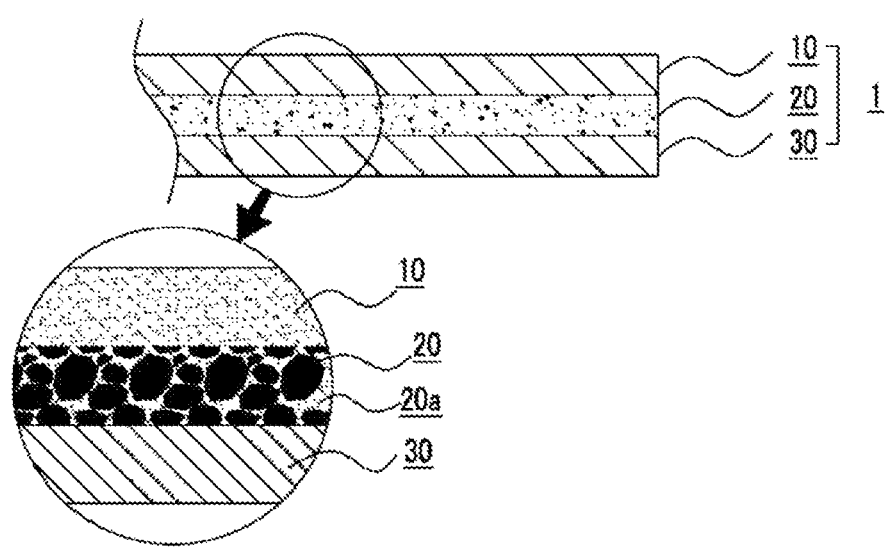
FIG. 1 is a cross-sectional view describing the constitution of the fused sheet for electromagnetic wave absorption/extinction and shielding, and the fused sheet for electronic equipment high heat dissipation according to the present invention.

FIG. 1 is a cross-sectional view illustrating the constitution of the fused sheet for electromagnetic wave absorption/extinction and shielding, and for electronic equipment high heat dissipation, in which in the case of the fused sheet for electromagnetic wave absorption/extinction and shielding, a premolded graphite sheet 10 prepared by molding a graphite substrate into a sheet form having a density in a range of 0.1-1.5 g/cm$^3$ and an incomplete state of crystal structure, is attached to one surface of a porous metal sheet 20 having a plurality of pores having a size of 0.01 mm-0.5 mm, to be integrally press molded, and a heat dissipation film layer 30 is formed on the outer surface; and in the case of the fused sheet for electronic equipment high heat dissipation, a premolded graphite sheet 10 prepared by molding a graphite substrate into a sheet form having a density in a range of 0.1-1.5 g/cm$^3$ and an incomplete state of crystal structure, is attached to one surface of a porous metal sheet 20 having a plurality of pores having a size of 0.001 mm-3.0 mm, to be integrally press molded, thereby forming pores having a size of 0.001 mm-0.05 mm, and a heat dissipation film layer 30 is formed on the outer surface.

That is, the present invention relates to a fused sheet for electromagnetic wave absorption/extinction and shielding, and a fused sheet for electronic equipment high heat dissipation, both of which is formed by the same constitutions and the same manufacturing process, but they are distinguished from each other depending on the size of the pores formed on the fused sheet prepared by integrally pressing the porous metal sheet and the graphite sheet. For further illustration, the fused sheet for electromagnetic wave absorption/extinction and shielding has the electromagnetic wave absorption/extinction and shielding property by integrally press molding the graphite sheet on the porous metal sheet having a pore size of 0.01 mm-0.5 mm; and the fused sheet for electronic equipment high heat dissipation is attached to electronic equipment to have the high heat dissipation property by integrally press molding the graphite sheet on the porous metal sheet having a pore size of 0.001 mm-3.0 mm, so as to finally have pores having a size of 0.001 mm-0.05 mm.

Figure 2:
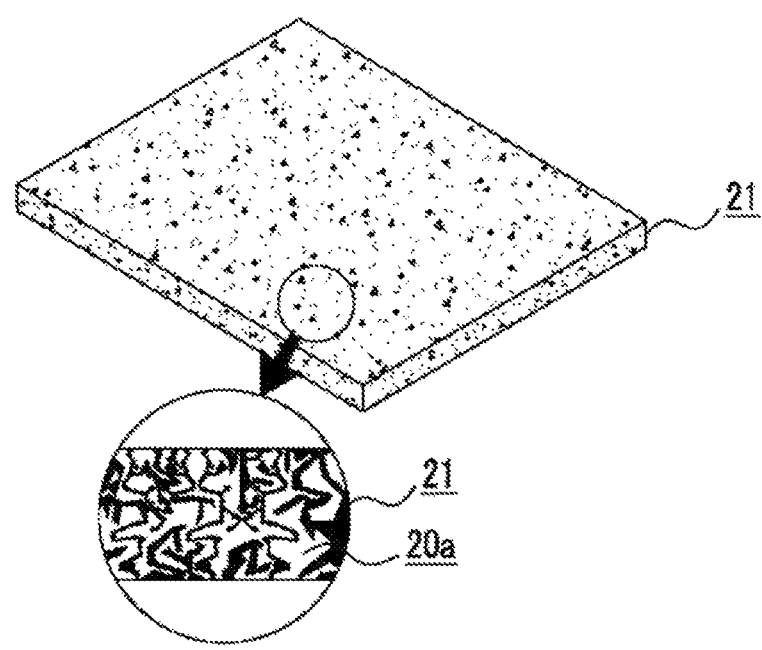
FIGS. 2 to 5 are drawings illustrating various exemplary embodiments of the porous metal sheet in the fused sheet for electromagnetic wave absorption/extinction and shielding, and the fused sheet for electronic equipment high heat dissipation according to the present invention.

FIG. 2 is a drawing schematically illustrating a porous metal sheet provided as a sintered sheet according to a first exemplary embodiment, in the fused sheet for electromagnetic wave absorption/extinction and shielding, and for electronic equipment high heat dissipation according to the present invention. In the drawing, a porous metal sheet provided as a sintered sheet 21, prepared by sintering copper-, tin-, zinc-, aluminum- or stainless-based metal powder having a particle size of 1 μm-200 μm by heating at a temperature lower than a melting temperature by 10-30%, which is then pressed, is illustrated, wherein the sintered sheet 21 is obtained by heating copper-, tin-, zinc-, aluminum- or stainless-based metal powder having a melting temperature of 300° C.-1800° C. and a particle size of 1 μm-200 μm under a condition of a temperature atmosphere lower than the melting temperature by 10-30% for 10-300 minutes, and the fused sheet for electronic equipment high heat dissipation is formed so as to have pores 20a of 0.05 mm-3.0 mm, and the fused sheet for electronic equipment high heat dissipation is formed so as to have pores 20a of 0.001 mm-3.0 mm.

Figure 3:
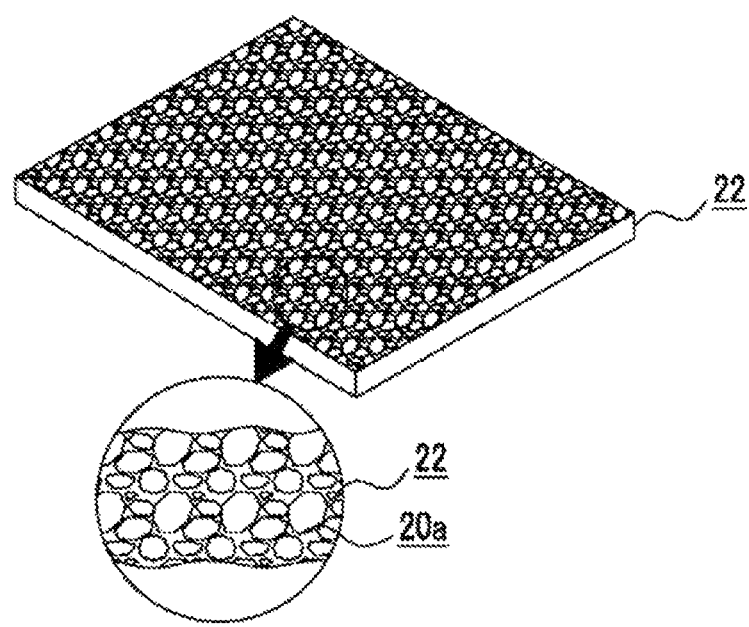

FIG. 3 is a drawing schematically illustrating the porous metal sheet provided as a metal electrolysis cast sheet according to a second exemplary embodiment, in the fused sheet for electromagnetic wave absorption/extinction and shielding, and for electronic equipment high heat dissipation according to the present invention, and in describing the drawing based on the fused sheet for electromagnetic wave absorption/extinction and shielding, a porous metal sheet provided as a metal electrolysis cast sheet 22 in a sheet form having a thickness of 0.01 mm-50 mm, by immersing a plate-shaped molding frame formed of a resin vaporized or liquefied at a high temperature in an electrolysis casting solution to be current applied, so that a metal is electrodeposited to form an electrodeposited layer, and heating the molding frame having this electrodeposited layer to remove the resin, thereby forming pores 20a, and if necessary, performing pressing 1 to 10 or more times, is illustrated in the drawing.

Meanwhile, in describing the drawing based on the fused sheet for electronic equipment high heat dissipation, a porous metal sheet provided as a metal electrolysis case sheet 22 in a sheet form having a thickness of 0.01 mm-50 mm, by immersing a plate-shaped molding frame formed of a resin vaporized or liquefied at a high temperature to be current applied, electrodepositing a metal to form an electrodeposited layer, and heating a molding frame having this electrodeposited layer to remove the resin, so as to form pores 20a having a size of 0.001 mm-3.0 mm, and if necessary, performing pressing 1 to 10 or more times, is illustrated in the drawing.

Figure 4:
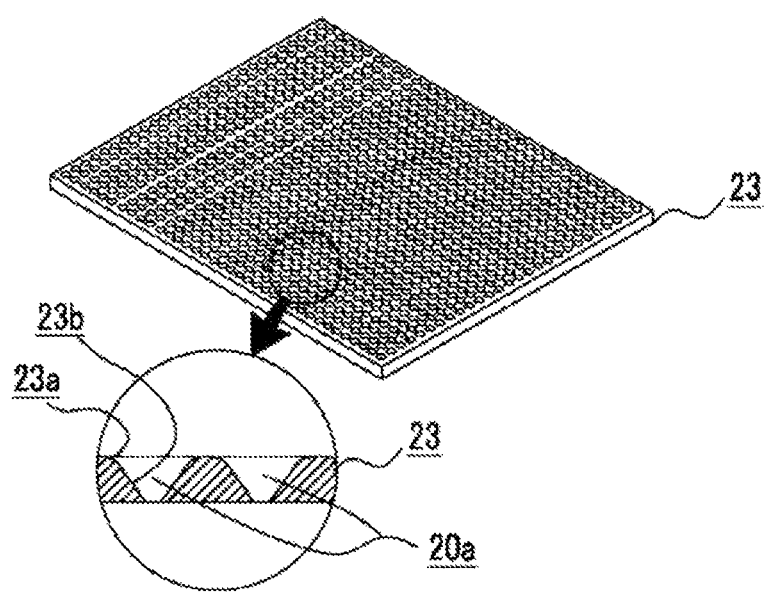

FIG. 4 is a drawing schematically illustrating a porous metal sheet provided as a thin plate sheet according to a third exemplary embodiment, in the fused sheet for electromagnetic wave absorption/extinction and shielding, and for electronic equipment high heat dissipation according to the present invention.

First, in describing the drawing based on the fused sheet for electromagnetic wave absorption/extinction and shielding, a porous metal sheet which is a metal thin plate sheet 23 prepared by forming pores on a thin plate formed of a copper-, tin-, zinc-, aluminum- or stainless-based metal material by a punching, laser or etching method to obtain a sheet member, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding, is illustrated in the drawing.

Subsequently, in describing the drawing based on the fused sheet for electronic equipment high heat dissipation, a porous metal sheet which is a metal thin plate sheet 23 prepared by forming pores having a size of 0.001 mm-3.0 mm on a thin plate formed of a copper-, tin-, zinc-, aluminum- or stainless-based metal material by a punching, laser or etching method to obtain a sheet member, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding, is illustrated in the drawing.

Figure 5:
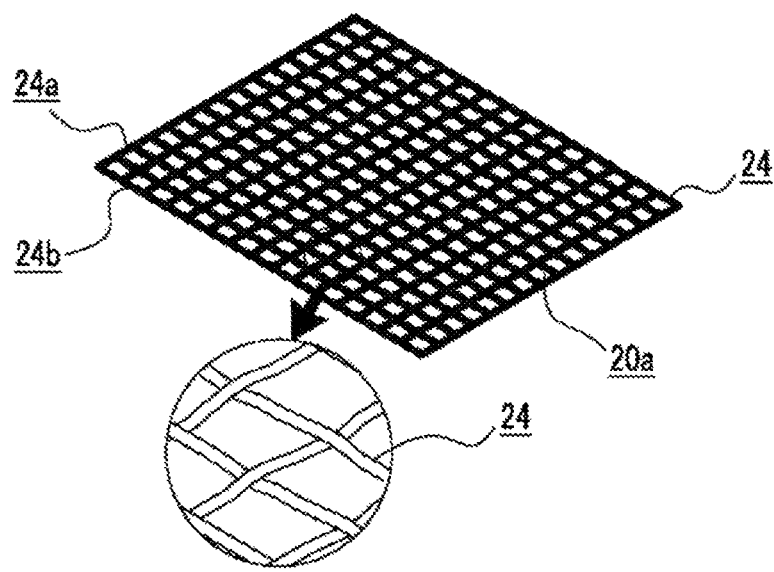

FIG. 5 is a drawing schematically describing a porous metal sheet provided as a net sheet 24 according to a fourth exemplary embodiment, in the fused sheet for electromagnetic wave absorption/extinction and shielding, and for electronic equipment high heat dissipation according to the present invention.

First, in describing the drawing based on the fused sheet for electromagnetic wave absorption/extinction and shielding, a porous metal sheet which is a net sheet 24 having pores 20a formed by weaving warp wires 24a and weft wires 24b formed of metal wire materials having a circular section so as to be intercrossed to each other, thereby forming pores between the weft wires and the warp wires is illustrated in the drawing, and in the present invention, it may be possible to weave the warp wires 24a and the weft wires 24b in a net shape by twisting two or more strands, in addition to using a single metal wire material.

Subsequently, a porous metal sheet which is a net sheet 24 having pores 20a formed by weaving warp wires 24a and weft wires 24b formed of metal wire materials having a circular section so as to be intercrossed to each other, thereby forming pores having a size of 0.001 mm-3.0 mm between the weft wires and the warp wires is illustrated in the drawing, and in the present invention, it may be possible to weave the warp wires 24a and the weft wires 24b in a net shape by twisting two or more strands, in addition to using a single metal wire material.

Figure 6:
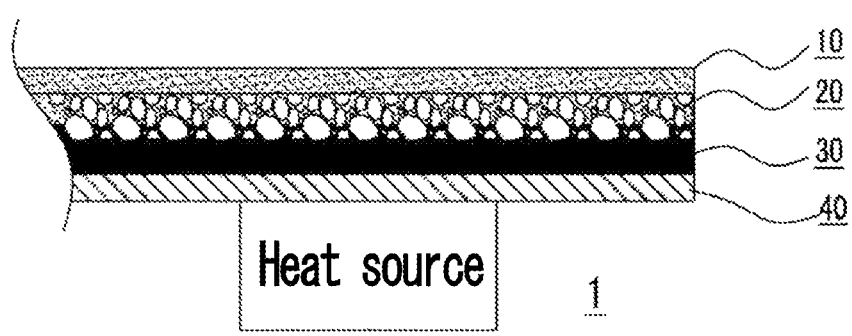
FIG. 6 is a cross-sectional view schematically illustrating an application example of the fused sheet for electromagnetic wave absorption/extinction and shielding, and the fused sheet for electronic equipment high heat dissipation according to the present invention.

FIG. 6 is a cross-sectional view for illustrating an application example of the fused sheet for electromagnetic wave absorption/extinction and shielding, and for electronic equipment high heat dissipation according to the present invention.

First, in describing the drawing based on the fused sheet for electromagnetic wave absorption/extinction and shielding, the fused sheet for electromagnetic wave absorption/extinction and shielding, prepared by stacking a premolded graphite sheet formed of a graphite substrate having an incomplete state of crystal structure on one surface of a porous metal sheet 20 formed of a porous metal having excellent thermal conductivity as a base substrate, and in this state, performing pressing with high pressure using pressing equipment such as a press or roller, so that a portion of the premolded graphite sheet is penetrated and impregnated into the inside of the porous metal sheet 20, forming a heat dissipation film layer 30 formed of any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by pressing and attaching a thin plate formed of aluminum or aluminum alloy, on the other surface of the porous metal sheet 20, and forming an insulating material 40 for contacting an electric heat source, is illustrated in the drawing.

Subsequently, in describing the drawing based on the fused sheet for electronic equipment high heat dissipation, the fused sheet for electronic equipment high heat dissipation, prepared by stacking a premolded graphite sheet formed of a graphite substrate having an incomplete state of crystal structure on one surface of a porous metal sheet 20 formed of a porous metal having excellent thermal conductivity as a base substrate, and in this state, performing pressing with high pressure using pressing equipment such as a press or roller, so that a portion of the premolded graphite sheet is penetrated and impregnated into the inside of the porous metal sheet 20, forming a heat dissipation film layer 30 formed of any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by pressing and attaching a thin plate formed of aluminum or aluminum alloy, on the other surface of the porous metal sheet 20, and forming an insulating material 40 for contacting an electric heat source on the outer surface of this heat dissipation film layer 30, is illustrated in the drawing.

Figure 7:
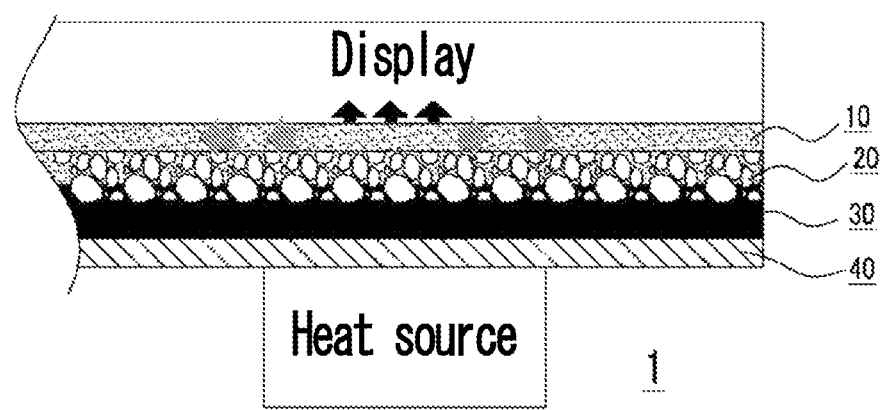
FIG. 7 is an exemplary view illustrating the properties of the fused sheet for electromagnetic wave absorption/extinction and shielding, and the fused sheet for electronic equipment high heat dissipation according to the present invention.

FIG. 7 is an exemplary drawing for describing the properties of the fused sheet for electromagnetic wave absorption/extinction and shielding, and for electronic equipment high heat dissipation according to the present invention.

First, in describing the drawing based on the fused sheet for electromagnetic wave absorption/extinction and shielding, as a configuration example, in which a heat source is disposed on the lower side of the fused sheet for electromagnetic wave absorption/extinction and shielding of the present invention, and a display is disposed on the upper side of the fused sheet, and the heat transferred from the heat source on the lower side is not transferred to the upper side, and diffused on the graphite sheet part horizontally to be heat dissipated, the fused sheet for electromagnetic wave absorption/extinction and shielding including a porous metal sheet 20 provided as a thin plate formed by sintering, metal electrolysis casting, punching or the like, or a net form formed by weaving wires; a premolded graphite sheet 10 which is integrally attached by press molding so that a portion of the crystal particles is impregnated into the pores on the surface side of the porous metal sheet 20, formed on the upper surface of the porous metal sheet 20; a heat dissipation film layer 30 formed of any one of an insulating material of an insulating composition, an adhesive material, and a soft metal thin plate, formed on the lower surface the porous metal sheet 20; and an insulating material 40 for contacting an electric heat source, on the lower surface of the heat dissipation film layer 30, is illustrated in the drawing.

Subsequently, in describing the drawing based on the fused sheet for electronic equipment high heat dissipation, as a configuration example, in which a heat source is disposed on the lower side of the fused sheet for electronic equipment high heat dissipation of the present invention, and a display is disposed on the upper side of the fused sheet, and the heat transferred from the heat source on the lower side is not transferred to the upper side, and diffused on the graphite sheet part horizontally to be heat dissipated, the fused sheet for electronic equipment high heat dissipation including a porous metal sheet 20 provided as a thin plate formed by sintering, metal electrolysis casting, punching or the like, or a net form formed by weaving wires; a premolded graphite sheet 10 which is integrally attached by press molding so that a portion of the crystal particles is impregnated into the pores on the surface side of the porous metal sheet 20, formed on the upper surface of the porous metal sheet 20; a heat dissipation film layer 30 formed of any one of an insulating material of an insulating composition, an adhesive material, and a soft metal thin plate, formed on the lower surface the porous metal sheet 20; and an insulating material 40 for contacting an electric heat source, on the lower surface of the heat dissipation film layer 30, is illustrated in the drawing.

FIGS. 8 to 11 are block diagrams for describing the method of manufacturing a fused sheet for electromagnetic wave absorption/extinction and shielding, and for electronic equipment high heat dissipation according to the present invention.

Figure 8:
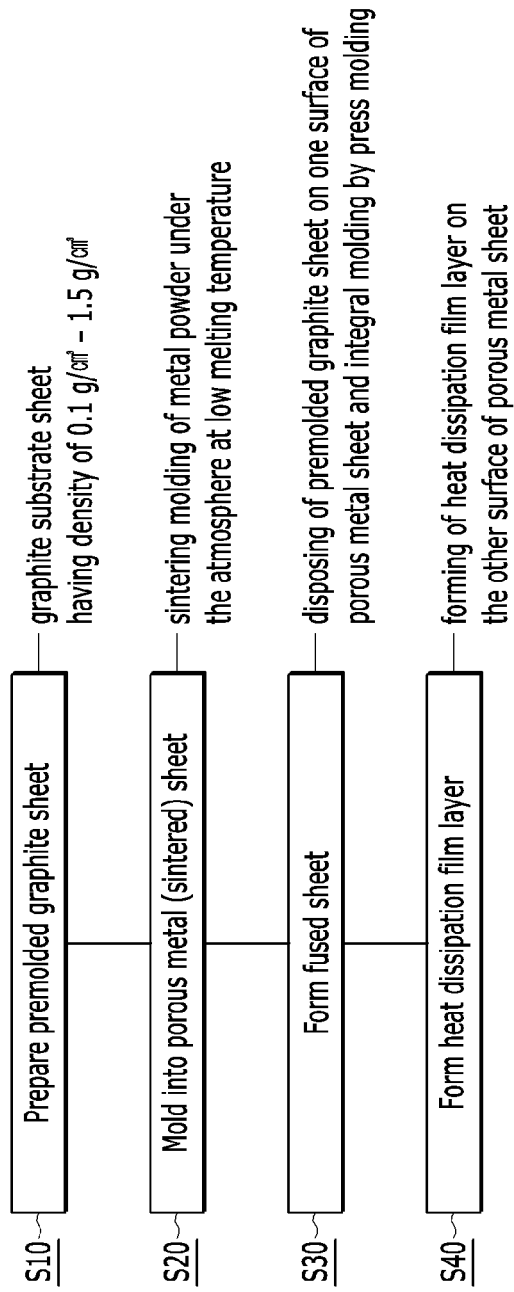
FIGS. 8 to 11 are schematic views illustration the method of manufacturing the fused sheet for electromagnetic wave absorption/extinction and shielding, and the fused sheet for electronic equipment high heat dissipation according to various exemplary embodiments of the present invention.

FIG. 8 represents a method of manufacturing a fused sheet for electromagnetic wave absorption/extinction and shielding, and for electronic equipment high heat dissipation, using a porous metal sheet prepared by preparing a premolded graphite sheet 10 formed of a graphite substrate having an incomplete state of crystal structure, disposing the premolded graphite sheet on one surface of the porous metal sheet 20 obtained by molding metal powder through a sintering process, and then performing pressing to be integrally attached, in which a process of forming a heat dissipation film layer 30 on the other surface of the porous metal sheet 20 for contacting a heat source is illustrated, and the heat dissipation film layer 30 may be formed on the fused sheet formed by press molding the premolded graphite sheet 10 and the porous metal sheet 20, or by stacking the premolded graphite sheet 10, the porous metal sheet 20, and the heat dissipation layer 30, and then performing integral press molding.

Figure 9:
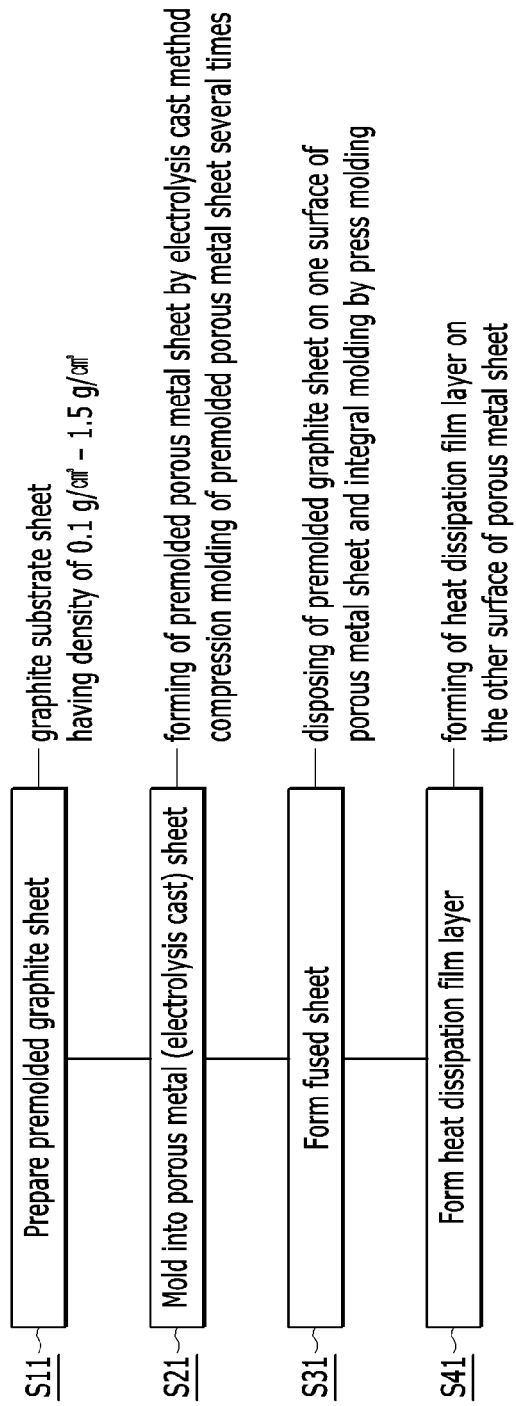

FIG. 9 illustrates a process of forming a diffused sheet by preparing a premolded graphite sheet 10 formed of a graphite substrate, having a density in a range of 0.1 g/cm$^3$-1.5 g/cm$^3$ and an incomplete state of crystal structure, and a porous metal sheet 20 prepared by applying a current flow solution on the outer surface of a plate-shaped molding frame formed by molding a resin vaporized or liquefied at a high temperature to form a current flow layer, which is then immersed in an electrolysis casting solution to be current applied to electrodeposit a metal, and heating the molding frame to remove the resin, respectively; and stacking them and attaching to each other integrally through press molding to form the fused sheet, in which the fused sheet has a heat dissipation film layer 30 for contacting a heat source on the other surface of the porous metal sheet to which the premolded graphite sheet 10 is not attached. Meanwhile, the heat dissipation layer 30 may be formed on the fused sheet formed by press molding the premolded graphite sheet 10 and the porous metal sheet 20, or the premolded graphite sheet 10, the porous metal sheet 20, and the heat dissipation layer 30 are stacked and press molded integrally.

Figure 10:
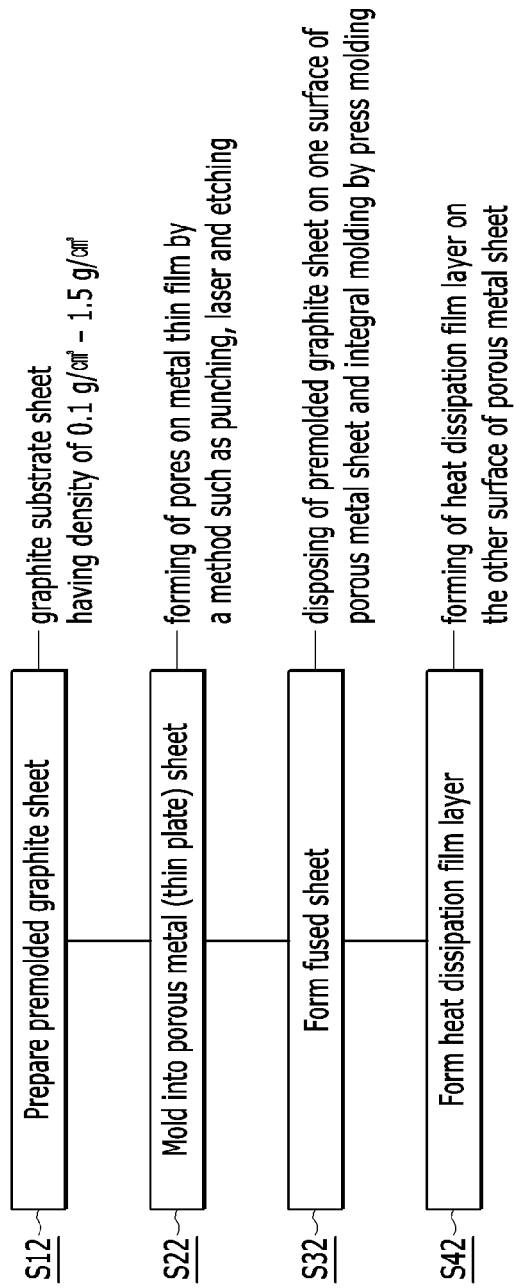

FIG. 10 includes a premolded graphite sheet formed of a graphite substrate having a density of 0.1 g/cm$^3$-1.5 g/cm$^3$ and an incomplete state of crystal structure, and a porous metal sheet 20 formed of a thin plate, prepared by perforating the thin plate of a metal material to form pores, the pore 20a including a curved portion 23a forming a gentle curved surface with the surface and an inclined portion 23b extending from this curved portion 23a, in which the porous metal sheet may be formed so that the crystal structure of the graphite substrate is not broken by the gentle curved portion 23a having the pores 20a in the course of integrally attaching the premolded graphite sheet in a state of being stacked on one surface by press molding, and impregnation density is increased by the inclined portion 23b.

Figure 11:
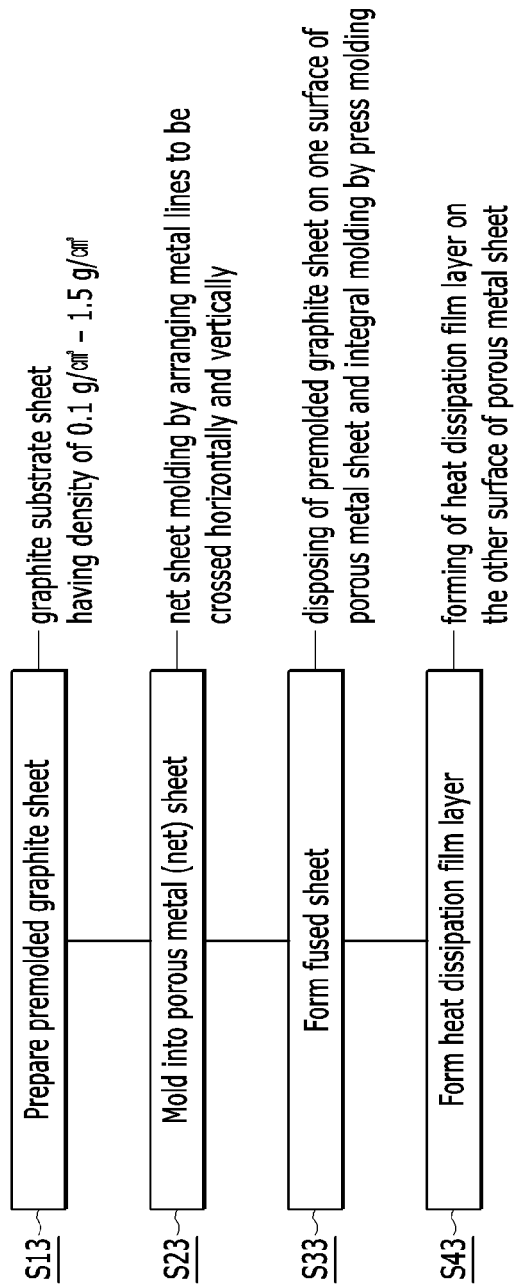

FIG. 11 includes a premolded graphite sheet formed of a graphite substrate having a density of 0.1 g/cm$^3$-1.5 g/cm$^3$ and an incomplete state of crystal structure, and a porous metal sheet 20 formed of a network sheet 24 prepared by weaving warp wires 24a and weft wires 24b having a circular or oval section into a net form to be intercrossed to each other, in which as the wire having a circular section is used, the crystal structure of the graphite substrate is not broken, and impregnated into the network forming the pores 20a to be integrally attached, in the course of press molding the porous metal sheet 20 integrally with the premolded graphite sheet 10, thereby forming the fused sheet.

Referring to the above drawings, the fused sheet for electromagnetic wave absorption/extinction and shielding and fused sheet for electronic equipment high heat dissipation according to the present invention will be described, in which first, the fused sheet for electromagnetic wave absorption/extinction and shielding, and then the fused sheet for electronic equipment high heat dissipation will be described.

The fused sheet for electromagnetic wave absorption/extinction and shielding 1 according to the present invention mainly includes a porous metal sheet 20 formed of a metal material having pores 15, in which a curved surface is formed without an edge so that the graphite crystal structure is not broken in the pressing process; a premolded graphite sheet 10 provided by being stacked on one surface of the porous metal sheet 20, in which the premolded graphite sheet is formed by molding a graphite substrate into a sheet form to have a density in a range of 0.1-1.5 g/cm$^3$ and an incomplete state of crystal structure, and being integrally attached by a pressing process; and a heat dissipation film layer 30 formed of a metal and organic/inorganic-based resin, provided by being stacked on the other surface of the porous metal sheet 20, which is integrally attached by pressing, application or impregnation, and a portion of which is impregnated through the pores formed on the surface of the porous metal sheet 20 into the premolded graphite sheet 10 on the opposite surface of the porous metal sheet and bound thereto. The present invention as described above may be manufactured by two main methods depending on the physical properties of the heat dissipation film layer 30. In the case that the heat dissipation film layer 30 is provided as a resin-based material, when it is attached in a coating form on one surface of the porous metal sheet 20, the premolded graphite sheet 10 is stacked one surface of the porous metal sheet 20 having a plurality of pores 20a formed thereon, and integrated by press molding, and then a resin-based composition forming the heat dissipation film layer 30 is integrally attached on the other surface of the porous metal sheet 20 by a method of application, spray, impregnation or the like. In the case that the heat dissipation film layer 30 is provided on a thin plate formed of aluminum or aluminum alloy, the premolded graphite sheet 10 and the heat dissipation film layer 30 are stacked one surface and the other surface of the porous metal sheet 20, respectively, and press molded at the same time, to be integrated.

The premolded graphite sheet 10 is prepared by premolding the graphite substrate into a sheet form, wherein the graphite substrate may be provided by compression molding graphite or graphite powder which occurs naturally as one of carbon isotopes or is artificially prepared, using a graphite composition of any one or more of organic-, inorganic- and ceramic-based materials with graphite, or molding any one of mixtures of a heat dissipation resin of any one or more of organic-, inorganic- and ceramic-based materials with graphite. This premolded graphite sheet 10 is a sheet form into which the metal thin plate sheet 23 is molded, and has a density in a range of 0.1-1.5 g/cm$^3$, so that the crystal structure is not completely bonded, and has an incomplete state. This is for densely compressing the crystal structure by press molding, in a state of being stacked on one surface of the porous metal sheet 20 as described below. If the premolded graphite sheet 10 has a dense tissue state, that is, a density of 1.6 g/cm$^3$ or more, the crystal structure will be broken after an integral press process in a state that the premolded graphite sheet is stacked the porous metal sheet 20 as described below, and consequently, the thermal conductivity and the thermal diffusion in a plane direction of the graphite sheet will be deteriorated.

The porous metal sheet 20 is a sheet material having a thickness of 0.01-0.5 mm, and prepared by forming pores 20a composed of fine holes or gaps connected to upper and lower surfaces, in which the pores 20a is evenly distributed, and have a size of 0.01 mm-3.0 mm connected to upper and lower surfaces. It is preferred that this porous metal sheet 20 is provided as a metal material having good thermal conductivity and elasticity to external force, and in the case that the metal has pores formed thereon, it has an absorption/dissipation function to electromagnetic waves, and particularly, as the pores are small, excellent shielding performance in a low frequency band may be secured. Thus, the present invention suggests that the pores 20a connected to upper and lower surface of the porous metal sheet 20 have a size of 0.01 mm-3.0 mm. This is because in the case that the pores 20a have a size less than 0.01 mm, the impregnation rate of the graphite substrate as a high performance electromagnetic wave shielding agent is too lowered due to micropores, resulting in also lowering the electromagnetic wave shielding performance, and in the case that the pores 20a have a size above 3 mm, the graphite substrate is impregnated and does not maintain a firmly binding state, and may be released or separated from the porous metal sheet 20. Therefore, the present invention suggests that the porous metal sheet 20 has the pores 20a having the size of 0.01 mm-3 mm, more preferably, 0.05 mm-1.0 mm. This porous metal sheet 20 may be various forms of metal sheets as long as it is provided as a metal sheet material having the pores 20a composed of fine holes or gaps, however, the pores 20a contacting the premolded graphite sheet 10 should be formed to entirely have a round shape without an edge, that is a gentle curved surface, so that in the course of pressing the premolded graphite sheet 10 stacked on one surface thereof, the crystal structure of the premolded graphite sheet 10 is not broken.

Meanwhile, it is suggested that the porous metal sheet 20 of the present invention is provided as a sintered sheet 21 manufactured by a sintering process, a metal electrolysis cast sheet 22 manufactured by a metal electrolysis casting method, a metal thin plate sheet 23 manufactured by perforating a metal thin plate, or a net sheet 24 manufactured by weaving wire into a net form, and hereinafter, various methods of manufacturing the porous metal sheet 20 will be described briefly.

Firstly, a sintered sheet 21 is a sheet material molded by heating metal powder having a particle size of 1 μm-200 μm at a temperature lower than a melting temperature to perform sintering so that the powder is not completely melted and connected to each other, and pressing the powder, as shown in FIG. 2. That is, the sintered sheet 21 is manufactured into a sheet form by preparing copper-, tin-, zinc-, aluminum- or stainless-based metal powder such as copper having a size of around 1 μm-200 μm and a melting temperature of 300° C.-1800° C., heating the metal powder at a temperature lower than the melting temperature by about 10%-30% for 10-300 minutes to be sintered, and then performing press molding into a sheet form with a pressure of 30 MPa-300 MPa 1 to dozens of times using pressing equipment such as a press or roller, thereby having a thickness of 0.01-0.5 mm, and a plurality of pores 20a formed thereon having a size of 0.01 mm-3.0 mm, connected to upper and lower surfaces.

Secondly, the metal electrolysis sheet 22 is provided by immersing a plate-shaped molding frame formed of a resin vaporized or liquefied at a high temperature to electrodeposit a metal to form an electrodeposited layer, and heating the molding frame having the electrodeposited layer formed thereon to remove the resin to form the pores 20a, and if necessary, pressing 1 to 10 or more times, into a sheet form having a thickness of 0.01 mm-50 mm, as shown in FIG. 3.

Thirdly, the metal thin plate sheet 23 is a sheet member prepared by forming pores on a thin plate formed of a copper-, tin-, zinc-, aluminum- or stainless-based metal material by a punching, laser or etching method, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding, as shown in FIG. 4.

Fourthly, the net sheet 24 is a porous metal sheet having pores 20a formed by weaving warp wires 24a and weft wires 24b formed of metal wire materials having a circular section so as to be intercrossed to each other, thereby forming pores between the weft wires and the warp wires, as illustrated, and in the present invention, it may be possible to weave the warp wires 24a and the weft wires 24b in a net shape by twisting two or more strands, in addition to using a single metal wire material, as shown in FIG. 5.

The thickness of the porous metal sheet 20 manufactured by various manufacturing methods as such may be adjusted by repeating pressing 1 or several times using pressing equipment such as a press or roller.

The heat dissipation film layer 30 is provided as metal and organic/inorganic-based resin, which is stacked on the opposite surface to the surface of the porous metal sheet 20 on which the premolded graphite sheet 10 stacked, and integrally attached by pressing, coating, impregnation or the like, and a portion of which is impregnated through the pores formed on the surface of the porous metal sheet 20 into the graphite sheet 10 on the opposite side, thereby forming binding force. This heat dissipation film layer 30 is integrally attached on the porous metal sheet 20, and may be formed of any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by attaching soft aluminum or aluminum, a portion of which is impregnated into the pores 20a on the surface of the porous metal sheet 20 by press bonding to the porous metal sheet 20 while having a good heat dissipation property, and it is also possible to form a plurality of layers. That is, the heat dissipation film layer 30 of the present invention is stacked on the lower surface of the porous metal sheet 20 on which a heat source (not shown) is disposed, as shown in FIG. 1, wherein the heat dissipation film layer 30 may be provided as a single layer of a resin-based insulating material, adherend, adhesive material or aluminum thin plate. It is also possible that the heat dissipation film layer 30 formed of a resin-based or aluminum thin plate is stacked on the lower surface of the porous metal sheet 20 on which a heat source is disposed, and an insulating layer 40 formed by coating an insulation resin composition of any one or more of PVC, PC, urethane, silicone, ABS and UV is formed on the lower surface of the heat dissipation film layer to form a multi-layered structure, shown in FIGS. 6 and 7.

Hereinafter, various methods of manufacturing the fused sheet for electromagnetic wave absorption/extinction and shielding according to the present invention will be described.

First Exemplary Embodiment

Referring to FIG. 8, the method of manufacturing a fused sheet for electromagnetic wave absorption/extinction and shielding according to a first exemplary embodiment of the present invention mainly includes preparing a premolded graphite sheet (s10), molding a porous metal sheet formed of a sintered sheet 21 (s20), forming a fused sheet (s30), and forming a heat dissipation thin layer (s40).

In the step of preparing a premolded graphite sheet (s10), graphite or graphite powder which is a graphite substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s20), copper-, tin-, zinc-, aluminum- or stainless-based metal powder having a melting temperature of 300° C.-1800° C. is prepared first, wherein the metal powder has a particle size of 1 μm-200 μm. Then, the thus-prepared metal powder is filled into a mold providing a molding space for molding a thin film material of a thin plate, and heated at a temperature lower than the melting temperature by 10%-30% depending on the melting properties of the metal power materials 10-300 minutes to be sintered, thereby manufacturing a sintered sheet 21. This sintered sheet 21 forms uniform pores 20a by stably fusing the interface of the metal powder with each other.

In the step of forming a fused sheet (s30), the premolded graphite sheet 10 is stacked on one surface of the porous metal sheet 20 and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.01 mm-0.5 mm. That is, pressing is performed to the porous metal sheet 20 which is the sintered sheet 21 and the premolded graphite sheet 10 stacked on one surface thereof at a pressure of 30 MPa-300 MPa 1-20 times, using pressing equipment, thereby resulting in a fused sheet having a thickness of 0.01 mm-50 mm. Here, as a pressing method for the stacked structure of the porous metal sheet 20 which is the sintered sheet 21 and the premolded graphite sheet 10, various pressing equipment may be used, and in the present invention, a press machine or a rolling mill in a roller pressing manner is suggested, and the pressing may be repeated about 1-20 times depending on the requirements of the product and the performance of the pressing equipment. Meanwhile, it is preferred that the fused sheet which is press molded by the press machine or the rolling mill in a roller pressing manner is pressed so that the upper and lower surfaces become flat, and as the sintering density is increased under a pressing process, the combining force between metal powder is increased, resulting in creased durability and elasticity. In addition, the process may be carried out at a room temperature, but it is preferred that the process is carried out at a temperature lower than the sintering temperature of the metal powder by 40% or less.

Meanwhile, it is possible to further perform molding into an amorphous metal sheet by heating the metal sheet at 500° C.-600° C. for 10-40 minutes to be amorphized before attaching the premolded graphite sheet 10 to the porous metal sheet 20 which is the sintered sheet 21, and it is also possible to attach the premolded graphite sheet to the amorphous metal sheet to be compression molded after the molding process.

In the step of forming a heat dissipation film layer (s40), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used. Meanwhile, as the heat dissipation film layer, a composition of any one or more of organic-, inorganic- and ceramic-based materials, a graphite composition of this composition with some of graphite, or a thin plate formed of soft aluminum or aluminum alloy may be used, and the heat dissipation film layer may be integrated into the porous metal sheet by a coating, impregnation, spray or press method, depending on the physical properties of the materials to be used.

In addition, it is illustrated in the present exemplary embodiment that the heat dissipation film layer 30 is formed on the fused sheet prepared by first pressing the porous metal sheet 20 which is the sintered sheet 21, and the premolded graphite sheet 10 to each other to be integrally combined, however, the present invention is not limited thereto, and it is also possible to stack the porous metal sheet 20 which is the sintered sheet 21, the premolded graphite sheet 10, and the heat dissipation film layer 30 to be integrated by the pressing process.

Second Exemplary Embodiment

Referring to FIG. 9, the method of manufacturing a fused sheet for electromagnetic wave absorption/extinction and shielding according to a second exemplary embodiment of the present invention mainly includes preparing a premolded graphite sheet (s11), molding a porous metal sheet formed of an electrolysis cast sheet 22 (s21), forming a fused sheet (s31), and forming a heat dissipation thin layer (s41).

The step of preparing a premolded graphite (s11) is substantially the same as the constitution of the first exemplary embodiment as described above. That is, graphite or graphite powder which is a graphite substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s21), a premolded porous metal sheet is molded by a metal electrolysis cast method, and then pressed several times by a pressing process to complete the porous metal sheet. That is, further describing the step of molding the porous metal sheet in the present exemplary embodiment, a current flow solution is applied first on the outer surface of a plate-shaped molding frame formed of a resin vaporized or liquefied at a high temperature to form a current flow layer, and the molding frame having the current flow layer formed thereon is immersed in an electrolysis casting solution. Then, the molding frame having the current flow layer immersed in the electrolysis casting solution is current applied to electrode-posit the metal, thereby forming an electrodeposited layer. Subsequently, when the molding frame having the electrodeposited layer formed thereon is taken out of the electrolysis cast, and heated to a predetermined temperature, the molding frame formed of a resin is melted to be removed, resulting in completing the premolded porous metal sheet composed of the electrodeposited layer having pores. Thereafter, the premolded porous metal sheet is pressed about 1 to 10 times using pressing equipment such as a roller or press, so as to have a thickness of 0.01 mm-50 mm, thereby completing the molding of the porous metal sheet.

In the step of forming a fused sheet (s31), the premolded graphite sheet 10 is stacked on one surface of the porous metal sheet 20 prepared by the electrolysis casting method and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.01 mm-0.5 mm. That is, pressing is performed to the porous metal sheet 20 which is the electrolysis cast sheet 22 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm. Here, as a pressing method for the stacked structure of the porous metal sheet 20 which is the electrolysis cast sheet 22 and the premolded graphite sheet 10, various pressing equipment may be used, and in the present invention, a press machine or a rolling mill in a roller pressing manner is suggested, and the pressing may be repeated about 1 to 20 times depending on the requirements of the product and the performance of the pressing equipment.

Meanwhile, it is preferred that the fused sheet which is press molded by the press machine or the rolling mill in a roller pressing manner is pressed so that the upper and lower surfaces become flat, and as the sintering density is increased under a pressing process, the combining force between metal powder is increased, resulting in creased durability and elasticity. In addition, the process may be carried out at a room temperature, but it is preferred that the process is carried out at a temperature lower than the sintering temperature of the metal powder by 40% or less. In addition, it is possible to further perform molding into an amorphous metal sheet by heating the metal sheet at 500° C.-600° C. for 10-40 minutes to be amorphized before attaching the premolded graphite sheet 10 to the porous metal sheet 20 which is the electrolysis cast sheet 22, and it is also possible to attach the premolded graphite sheet to the amorphous metal sheet to be compression molded after the molding process.

In the step of forming a heat dissipation film layer (s41), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used. Meanwhile, as the heat dissipation film layer, a composition of any one or more of organic-, inorganic- and ceramic-based materials, a graphite composition of this composition with some of graphite, or a thin plate formed of soft aluminum or aluminum alloy may be used, and the heat dissipation film layer is integrated into the porous metal sheet by a coating, impregnation, spray or press method, depending on the physical properties of the materials to be used.

In addition, it is illustrated in the present exemplary embodiment that the heat dissipation film layer 30 is formed on the fused sheet prepared by first pressing the porous metal sheet 20 which is the electrolysis cast sheet 22, and the premolded graphite sheet 10 to each other to be integrally combined, however, the present invention is not limited thereto, and it is also possible to stack the porous metal sheet 20 which is the electrolysis cast sheet 22, the premolded graphite sheet 10, and the heat dissipation film layer 30 to be integrated by the pressing process.

Third Exemplary Embodiment

Referring to FIG. 10, the method of manufacturing a fused sheet for electromagnetic wave absorption/extinction and shielding according to a third exemplary embodiment of the present invention mainly includes preparing a premolded graphite sheet (s12), molding a porous metal sheet formed of a metal thin plate sheet 23 (s22), forming a fused sheet (s32), and forming a heat dissipation thin layer (s42).

In the step of preparing a premolded graphite sheet (s12), graphite or graphite powder which is a substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s22), a metal thin plate sheet 23 formed by perforating the metal thin plate is used, wherein the metal thin plate sheet 23 is a sheet material having pores on the thin plate formed of a copper, tin, zinc, aluminum or stainless-based metal material, using a puncing, laser, etching method. Here, the pores 25 which are holes formed on the metal thin plate sheet 23 should be provided so that the crystal structure is not broken in a state that the premolded graphite sheet 10 is attached by press molding. For this, it was suggested in the present invention that based on one surface to which the premolded graphite sheet 10 is attached, the a curved portion 23*a* forming a curved shape with the surface and an inclined portion 23*b* where a diameter is gradually decreased from this curved portion 23*a* to the inside of the holes are formed. That is, as the metal thin plate sheet 23, various forms of metal thin plate sheet may be used, as long as it is provided as a sheet material formed of a metal thin plate having the pores 20*a* composed of fine holes or gaps, however, the pores 20*a* contacting the premolded graphite sheet 10, and the surfaces connected to these pores 25 should be formed to entirely have a round shape without an edge, that is a gentle curved surface, so that in the course of pressing the premolded graphite sheet 10 stacked on one surface thereof, the crystal structure of the premolded graphite sheet 10 is not broken.

In the step of forming a fused sheet (s32), the premolded graphite sheet 10 is stacked on one surface of the porous metal sheet 20 provided as the metal thin plate sheet 23 and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.01 mm-0.5 mm. That is, pressing is performed to the porous metal sheet 20 which is the metal thin plate sheet 23 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm. Here, as a pressing method for the stacked structure of the porous metal sheet 20 which is the metal thin plate sheet 23 and the premolded graphite sheet 10, various pressing equipment may be used, and in the present invention, a press machine or a rolling mill in a roller pressing manner is suggested, and the pressing may be repeated about 1 to 20 times depending on the requirements of the product and the performance of the pressing equipment. Meanwhile, it is preferred that the fused sheet which is press molded by the press machine or the rolling mill in a roller pressing manner is pressed so that the upper and lower surfaces become flat, and as the sintering density is increased under a pressing process, the combining force between metal powder is increased, resulting in creased durability and elasticity. In addition, the process may be carried out at a room temperature, but it is preferred that the process is carried out at a temperature lower than the sintering temperature of the metal powder by 40% or less. In addition, it is possible to further perform molding into an amorphous metal sheet by heating the metal sheet at 500° C.-600° C. for 10-40 minutes to be amorphized before attaching the premolded graphite sheet 10 to the porous metal sheet which is the metal thin plate sheet 23, and it is also possible to attach the premolded graphite sheet to the amorphous metal sheet to be compression molded after the molding process.

In the step of forming a heat dissipation film layer (s42), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used. Meanwhile, as the heat dissipation film layer, a composition of any one or more of organic-, inorganic- and ceramic-based materials, a graphite composition of this composition with some of graphite, or a thin plate formed of soft aluminum or aluminum alloy may be used, and the heat dissipation film layer is integrated into the porous metal sheet 20 by a coating, impregnation, spray or press method, depending on the physical properties of the materials to be used.

In addition, it is illustrated in the present exemplary embodiment that the heat dissipation film layer 30 is formed on the fused sheet prepared by first pressing the porous metal sheet 20 which is the metal thin plate sheet 23, and the premolded graphite sheet 10 to each other to be integrally combined, however, the present invention is not limited thereto, and it is also possible to stack the porous metal sheet 20 which is the metal thin plate sheet 23, the premolded graphite sheet 10, and the heat dissipation film layer 30 to be integrated by the pressing process.

Fourth Exemplary Embodiment

Referring to FIG. 11, the method of manufacturing a fused sheet for electromagnetic wave absorption/extinction and shielding according to a fourth exemplary embodiment of the present invention mainly includes preparing a premolded graphite sheet (s13), molding a porous metal sheet formed of a metal thin plate sheet 23 (s23), forming a fused sheet (s33), and forming a heat dissipation thin layer (s43)

In the step of preparing a premolded graphite sheet (s13), graphite or graphite powder which is a substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s23), a net sheet 24 in a net form prepared by weaving warp wires 24a and weft wires 24b having a circular section formed of a metal material to be intercrossed, thereby forming pores between the warp wire 24a and the weft wire 24b, is used. Meanwhile, it is also possible to weave the warp wires 24a and the weft wires 24b which are the metal material into a net shape, using a twisted wire material prepared by twisting two or more strands, in addition to using a single metal material. In addition, it is also possible to further perform the pressing process using a roller, press equipment or the like, in order to reduce the thickness of the net sheet 24.

In the step of forming a fused sheet (s33), the premolded graphite sheet 10 is stacked on one surface of the porous metal sheet 20 provided as the net sheet 24 and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.01 mm-0.5 mm. That is, pressing is performed to the porous metal sheet 20 which is the net sheet 24 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm. Here, as a pressing method for the stacked structure of the porous metal sheet 20 which is the net sheet 24 and the premolded graphite sheet 10, various pressing equipment may be used, and in the present invention, a press machine or a rolling mill in a roller pressing manner is suggested, and the pressing may be repeated about 1 to 20 times depending on the requirements of the product and the performance of the pressing equipment. Meanwhile, it is preferred that the fused sheet which is press molded by the press machine or the rolling mill in a roller pressing manner is pressed so that the upper and lower surfaces become flat, and as the sintering density is increased under a pressing process, the combining force between metal powder is increased, resulting in creased durability and elasticity. In addition, the process may be carried out at a room temperature, but it is preferred that the process is carried out at a temperature lower than the sintering temperature of the metal powder by 40% or less. In addition, it is possible to further perform molding into an amorphous metal sheet by heating the metal sheet at 500° C.-600° C. for 10-40 minutes to be amorphized before attaching the premolded graphite sheet 10 to the porous metal sheet 20 which is the net sheet 24, and it is also possible to attach the premolded graphite sheet to the amorphous metal sheet to be compression molded after the molding process.

In the step of forming a heat dissipation film layer (s42), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used. Meanwhile, as the heat dissipation film layer 30, a composition of any one or more of organic-, inorganic- and ceramic-based materials, a graphite composition of this composition with some of graphite, or a thin plate formed of soft aluminum or aluminum alloy may be used, and the heat dissipation film layer may be integrated into the porous metal sheet 20 by a coating, impregnation, spray or press method, depending on the physical properties of the materials to be used. In addition, it is illustrated in the present exemplary embodiment that the heat dissipation film layer 30 is formed on the fused sheet prepared by first pressing the porous metal sheet 20 which is the net sheet 24, and the premolded graphite sheet 10 to each other to be integrally combined, however, the present invention is not limited thereto, and it is also possible to stack the porous metal sheet 20 which is the net sheet 24, the premolded graphite sheet 10, and the heat dissipation film layer 30 to be integrated by the pressing process.

The method of manufacturing a fused sheet for electromagnetic wave absorption/extinction and shielding to which the porous metal sheet 20 prepared by the various preparation methods as described above is applied has a simple manufacturing process, thereby allowing economical production through mass production. Particularly, in the course of forming the fused sheet by pressing the premolded graphite sheet 10 having an incomplete state of crystal structure and the porous metal sheet 20 together, the graphite crystals forming the graphite sheet 10 are impregnated into the premolded pores 25 to maintain firm bonding force, and aiming at improved performance of electromagnetic wave absorption/extinction and shielding, and also, the heat dissipation film layer 30 formed on the other surface of the porous metal sheet 20 opposite to the premolded graphite sheet 10 is physically firmly integrated, as the components thereof are impregnated through the pores 25 into the premolded graphite sheet 10.

Hereinafter, referring to FIGS. 1 to 11, the fused sheet for electronic equipment high heat dissipation, and the method of manufacturing the same, according to the present invention will be described, however, there is only a difference in the size of the pores formed on the fused sheet from the fused sheet for electrowave absorption/extinction and shielding, and the method of manufacturing the same. Thus, the same reference number is assigned to the same component, and some overlapping description is omitted.

The fused sheet for electronic equipment high heat dissipation 1 according to the present invention mainly includes a porous metal sheet 20 formed of a metal material having pores 15, in which a curved surface is formed without an edge so that the graphite crystal structure is not broken in the pressing process; a premolded graphite sheet 10 provided by being stacked on one surface of the porous metal sheet 20, in which the premolded graphite sheet is formed by molding a graphite substrate into a sheet form to have a density in a range of 0.1-1.5 $g/cm^3$ and an incomplete state of crystal structure, and being integrally attached by a pressing process; and optionally, a heat dissipation film layer 30 formed of a metal and organic/inorganic-based resin, provided by being stacked on the other surface of the porous metal sheet 20, which is integrally attached by pressing, application or impregnation, and a portion of which is impregnated through the pores formed on the surface of the porous metal sheet 20 into the premolded graphite sheet 10 on the opposite surface of the porous metal sheet and bound thereto. Here, the porous metal sheet 20 has a characteristic of forming a plurality of pores having a size of 0.001 mm-0.05 mm connected to the upper and lower surfaces by being integrally attached to and combined with the preformed graphite sheet, so as to have a density of 1.6 $g/cm^3$-6.0 $g/cm^3$. The present invention as described above may be manufactured by two main methods depending on the physical properties of the heat dissipation film layer 30. In the case that the heat dissipation film layer 30 is provided as a resin-based material, when it is attached in a coating form on one surface of the porous metal sheet 20, the premolded graphite sheet 10 is stacked one surface of the porous metal sheet 20 having a plurality of pores 20a formed thereon, and integrated by press molding, and then a resin-based composition forming the heat dissipation film layer 30 is integrally attached on the other surface of the porous metal sheet 20 by a method of application, spray, impregnation or the like. In the case that the heat dissipation film layer 30 is provided on a thin plate formed of aluminum or aluminum alloy, the premolded graphite sheet 10 and the heat dissipation film layer 30 are stacked one surface and the other surface of the porous metal sheet 20, respectively, and press molded at the same time, to be integrated.

The premolded graphite sheet 10 is substantially the same as the constitution of the fused sheet for electromagnetic wave absorption/extinction and shielding as described above, and thus, detailed description is omitted.

The porous metal sheet 20 is a sheet material having a thickness of 0.01-50 mm, and prepared by forming pores 20a composed of fine holes or gaps connected to upper and lower surfaces, in which the pores 20a is evenly distributed, and have a size of 0.001 mm-3.0 mm connected to upper and lower surfaces. It is preferred that this porous metal sheet 20 is provided as a metal material having good thermal conductivity and elasticity to external force, and in the case that the metal has pores formed thereon, it has an absorption/dissipation function to electromagnetic waves, and particularly, as the pores are small, excellent shielding performance in a low frequency band may be secured. Thus, the present invention suggests that the pores 20a connected to upper and lower surface of the porous metal sheet 20 have a size of 0.01 mm-3.0 mm This is because in the case that the pores 20a have a size less than 0.001 mm, processing is difficult, and also the impregnation rate of the graphite substrate which is a heat dissipation material is too lowered due to micropores, resulting in also lowering the electromagnetic wave shielding performance, and on the contrary, in the case that the pores 20a have a size above 3 mm, the graphite substrate is impregnated and does not maintain a firmly binding state, and may be released or separated from the porous metal sheet 20. Therefore, the present invention suggests that the porous metal sheet 20 has the pores 20a having the size of 0.001 mm-3 mm. As the porous metal sheet 20, various forms of metal sheet may be used, as long as it is provided as a sheet material having the pores 20a composed of fine holes or gaps, however, the pores 20a contacting the premolded graphite sheet 10 should be formed to entirely have a round shape without an edge, that is a gentle curved surface, so that in the course of pressing the premolded graphite sheet 10 stacked on one surface thereof, the crystal structure of the premolded graphite sheet 10 is not broken.

Meanwhile, it is suggested that the porous metal sheet 20 of the present invention is provided as a sintered sheet 21 manufactured by a sintering process, a metal electrolysis cast sheet 22 manufactured by a metal electrolysis casting method, a metal thin plate sheet 23 manufactured by perforating a metal thin plate, or a net sheet 24 manufactured by weaving wire into a net form, and hereinafter, various methods of manufacturing the porous metal sheet 20 will be described briefly.

Firstly, a sintered sheet 21 is a sheet material molded by heating metal powder having a particle size of 1 µm-200 µm at a temperature lower than a melting temperature to perform sintering so that the powder is not completely melted and connected to each other, and pressing the powder, as shown in FIG. 2. That is, the sintered sheet 21 is manufactured into a sheet form by preparing copper-, tin-, zinc-, aluminum- or stainless-based metal powder such as copper having a size of around 1 µm-200 µm and a melting temperature of 300° C.-1800° C., heating the metal powder at a temperature lower than the melting temperature by about 10%-30% for 10-300 minutes to be sintered, and then performing press molding into a sheet form with a pressure of 30 MPa-300 MPa 1 to dozens of times using pressing equipment such as a press or roller, thereby having a thickness of 0.01-50 mm, and a plurality of pores formed thereon having a size of 0.001 mm-3.0 mm, connected to upper and lower surfaces.

Secondly, the metal electrolysis sheet 22 is provided by immersing a plate-shaped molding frame formed of a resin vaporized or liquefied at a high temperature to electrodeposit a metal to form an electrodeposited layer, and heating the molding frame having the electrodeposited layer formed thereon to remove the resin to form the pores 20a having a size of 0.001 mm-3.0 mm, and if necessary, pressing 1 to 10 or more times, into a sheet form having a thickness of 0.01 mm-50 mm, as shown in FIG. 3.

Thirdly, the metal thin plate sheet 23 is a sheet member prepared by forming pores having a size of 0.001 mm-3.0 mm on a thin plate formed of a copper-, tin-, zinc-, aluminum- or stainless-based metal material by a punching, laser or etching method, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding, as shown in FIG. 4.

Fourthly, the net sheet 24 is a porous metal sheet having pores 20a formed by weaving warp wires 24a and weft wires 24b formed of metal wire materials having a circular section so as to be intercrossed to each other, thereby forming pores 20a having a size of 0.001 mm-3.0 mm between the weft wires and the warp wires, as illustrated, and in the present invention, it may be possible to weave the warp wires 24a and the weft wires 24b in a net shape by twisting two or more strands, in addition to using a single metal wire material, as shown in FIG. 5. The thickness and pore size of the porous metal sheet 20 manufactured by various manufacturing methods as such may be adjusted by repeating pressing 1 or several times using pressing equipment such as a press or roller.

The heat dissipation film layer 30 is provided as metal and organic/inorganic-based resin, which is stacked on the opposite surface to the surface of the porous metal sheet 20 on which the premolded graphite sheet stacked, and integrally attached by pressing, coating, impregnation or the like, and a portion of which is impregnated through the pores formed on the surface of the porous metal sheet 20 into the graphite sheet 10 on the opposite side, thereby forming binding force. This heat dissipation film layer 30 is integrally attached on the porous metal sheet 20, and may be formed of any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by attaching soft aluminum or aluminum, a portion of which is impregnated into the pores 20a on the surface of the porous metal sheet 20 by press bonding to the porous metal sheet 20 while having a good heat dissipation property, and it is also possible to form a plurality of layers.

Hereinafter, various methods of manufacturing a fused sheet for electronic equipment high heat dissipation according to the present invention will be described, however, since it is manufactured by a very similar process to the method of manufacturing the fused sheet for electromagnetic wave absorption/extinction and shielding, the same reference number is assigned to the same process, and detailed overlapping description is omitted.

First Exemplary Embodiment

Referring to FIG. 8, the method of manufacturing a fused sheet for electronic equipment high heat dissipation according to a first exemplary embodiment of the present invention mainly includes preparing a premolded graphite sheet (s10), molding a porous metal sheet formed of a sintered sheet 21 (s20), forming a fused sheet (s30), and forming a heat dissipation thin layer (s40).

In the step of preparing a premolded graphite sheet (s10), graphite or graphite powder which is a graphite substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure.

In the step of molding a porous metal sheet (s20), copper-, tin-, zinc-, aluminum- or stainless-based metal powder having a melting temperature of 300° C.-1800° C. is prepared first, wherein the metal powder has a particle size of 1 µm-200 µm. Then, the thus-prepared metal powder is filled into a mold providing a molding space for molding a thin film material of a thin plate, and heated at a temperature lower than the melting temperature by 10%-30% depending on the melting properties of the metal power materials for 10-300 minutes to be sintered, thereby manufacturing a sintered sheet 21. This sintered sheet 21 forms uniform pores 20a having a size of 0.001 mm-3.0 mm by stably fusing the interface of the metal powder with each other.

In the step of forming a fused sheet (s30), the premolded graphite sheet 10 is stacked on one surface of the porous metal sheet 20 and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.01 mm-0.5 mm. That is, pressing is performed to the porous metal sheet 20 which is the sintered sheet 21 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm.

In the step of forming a heat dissipation film layer (s40), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used.

Second Exemplary Embodiment

Referring to FIG. 9, the method of manufacturing a fused sheet for electronic equipment high heat dissipation according to a second exemplary embodiment of the present invention mainly includes preparing a premolded graphite sheet (s11), molding a porous metal sheet formed of an electrolysis cast sheet 22 (s21), forming a fused sheet (s31), and forming a heat dissipation thin layer (s41).

The step of preparing a premolded graphite sheet (s11) is substantially the same as the constitution of the first exemplary embodiment as described above. That is, graphite or graphite powder which is a graphite substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s21), a premolded porous metal sheet is molded by a metal electrolysis cast method, and then pressed several times by a pressing process to complete the porous metal sheet. That is, further describing the step of molding the porous metal sheet in the present exemplary embodiment, a current flow solution is applied first on the outer surface of a plate-shaped molding frame formed of a resin vaporized or liquefied at a high temperature to form a current flow layer, and the molding frame having the current flow layer formed thereon is immersed in an electrolysis casting solution. Then, the molding frame having the current flow layer immersed in the electrolysis casting solution is current applied to electrodeposit the metal, thereby forming an electrodeposited layer. Subsequently, when the molding frame having the electrodeposited layer formed thereon is taken out of the electrolysis cast, and heated to a predetermined temperature, the molding frame formed of a resin is melted to be removed, resulting in completing the premolded porous metal sheet composed of the electrodeposited layer having pores having a size of 0.001 mm-3.0 mm. Thereafter, the premolded porous metal sheet is pressed about 1 to 10 times using pressing equipment such as a roller or press, so as to have a thickness of 0.01 mm-50 mm, thereby completing the molding of the porous metal sheet.

In the step of forming a fused sheet (s31), the premolded graphite sheet 10 is stacked on one surface of the porous metal sheet 20 prepared by the electrolysis casting method and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.001 mm-0.05 mm. That is, pressing is performed to the porous metal sheet 20 which is the electrolysis cast sheet 22 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm.

In the step of forming a heat dissipation film layer (s41), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used.

Third Exemplary Embodiment

Referring to FIG. 10, the method of manufacturing a fused sheet for electronic equipment high heat dissipation according to a third exemplary embodiment of the present invention mainly includes preparing a premolded graphite sheet (s12), molding a porous metal sheet formed of a metal thin plate sheet 23 (s22), forming a fused sheet (s32), and forming a heat dissipation thin layer (s42).

In the step of preparing a premolded graphite sheet (s12), graphite or graphite powder which is a substrate is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s22), a metal thin plate sheet 23 formed by perforating the metal thin plate is used, wherein the metal thin plate sheet 23 is a sheet material having pores having a size of 0.001 mm-3.0 mm on the thin plate formed of a copper, tin, zinc, aluminum or stainless-based metal material, using a puncing, laser, etching method.

In the step of forming a fused sheet (s32), the premolded graphite sheet 10 is stacked on one surface of the porous metal sheet 20 provided as the metal thin plate sheet 23 and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.001 mm-0.05 mm. That is, pressing is performed to the porous metal sheet 20 which is the metal thin plate sheet 23 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm.

In the step of forming a heat dissipation film layer (s42), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used.

Fourth Exemplary Embodiment

Referring to FIG. 11, the method of manufacturing a fused sheet for electronic equipment high heat dissipation according to a fourth exemplary embodiment of the present invention mainly includes preparing a premolded graphite sheet (s13), molding a porous metal sheet formed of a metal thin plate sheet 23 (s23), forming a fused sheet (s33), and forming a heat dissipation thin layer (s43).

In the step of preparing a premolded graphite sheet (s13), graphite or graphite powder which is a substrate, is compression molded, or a graphite substrate formed of a graphite composition of any one or more of organic-, inorganic- and ceramic-based materials with graphite, or a mixture of a heat dissipation resin of any one or more of organic-, inorganic- and ceramic-based materials with graphite is prepared, and premolded into a sheet form having a density in a range of 0.1 g/cm$^3$-1.5 g/cm$^3$ and an incomplete state of crystal structure. Since the premolding method at this time may be carried out in various ways, detailed description thereof will be omitted.

In the step of molding a porous metal sheet (s23), a net sheet 24 in a net form prepared by weaving warp wires 24$a$ and weft wires 24$b$ having a circular section formed of a metal material to be intercrossed, thereby forming pores between the warp wire 24$a$ and the weft wire 24$b$, is used.

In the step of forming a fused sheet (s33), the premolded graphite sheet 10 is stacked on one surface of the porous metal sheet 20 provided as the net sheet 24 and pressed, thereby impregnating the graphite crystals forming the graphite sheet into the pores on the surface of the porous metal sheet to be integrally combined, so as to have a density in a range of 1.6 g/cm$^3$-6.0 g/cm$^3$, and a pore size of 0.001 mm-0.05 mm. That is, pressing is performed to the porous metal sheet 20 which is the net sheet 24 and the premolded graphite sheet 10 stacked on one surface thereof at a pressure of 30 MPa-300 MPa 1 to 20 times, using pressing equipment, thereby resulting in a fused sheet having a thickness of 0.01 mm-50 mm.

In the step of forming a heat dissipation film layer (s42), the heat dissipation film layer is stacked on the other surface of the porous metal sheet 20, that is, the opposite surface on which the premolded graphite sheet 10 is not attached. This heat dissipation film layer 30 is stacked on the other surface of the porous metal sheet 20, and in this state, integrally attached by pressing, coating or impregnation, and as the heat dissipation film layer, a thin plate formed of organic/inorganic-based resin or aluminum or aluminum alloy, a portion of which is impregnated into the pores formed on the surface of the porous metal sheet to be attached on the graphite sheet on the opposite side, thereby producing integral bonding force, is used.

The method of manufacturing a fused sheet for electronic equipment high heat dissipation to which the porous metal sheet 20 prepared by the various preparation methods as described above is applied has a simple manufacturing process, thereby allowing economical production through mass production. Particularly, in the course of forming the fused sheet by pressing the premolded graphite sheet 10 having an incomplete state of crystal structure and the porous metal sheet 20 together, the graphite crystals forming the graphite sheet 10 are impregnated into the premolded pores 25 of the porous metal sheet 20 to maintain firm bonding force, and thus, a problem of a reduced heat dissipation property by a heat dissipation interference phenomenon due to the use of a resin or binder material having adhesive components may be solved, thereby guaranteeing excellent heat dissipation performance.

Particularly, the heat dissipation film layer 30 formed on the other surface of the porous metal sheet 20 opposite to the premolded graphite sheet 10 is also physically firmly integrated, as the components thereof are impregnated through the pores 25 into the premolded graphite sheet 10, and thus, elasticity and durability may be increased, resulting in mass production of a large area sheet.

Hereinabove, the exemplary embodiments of the present invention is described, referring to the attached drawings, however, a person with ordinary skill in the art to which the present invention pertains may understand that other specific forms of the present invention are carried out without modifying the technical sprit or essential characteristic. Therefore, it is to be understood that the exemplary embodiments as described above are illustrative in all aspects, and are not limited.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

The invention claimed is:

1. A fused sheet for electromagnetic wave absorption/extinction and shielding, comprising:
   a premolded graphite sheet prepared by molding a graphite substrate including graphite into a sheet form, wherein the premolded graphite sheet has a density in a range of 0.1-1.5 g/cm$^3$; and
   a porous metal sheet having a plurality of pores including fine holes or gaps and having a size of 0.01 mm-0.5 mm connected to upper and lower surfaces of the porous metal sheet, wherein the premolded graphite sheet is stacked on one surface of the porous metal sheet, and press molded such that a portion of crystal particles of the graphite substrate is impregnated into the plurality of pores to be physically attached and combined to the plurality of pores, so as to have a density of 2.0 g/cm$^3$-6.0 g/cm$^3$.

2. The fused sheet for electromagnetic wave absorption/extinction and shielding of claim 1, wherein the graphite sheet is prepared by compression molding graphite or graphite powder, using a graphite composition of any one of more of organic-, inorganic- and ceramic-based materials with graphite, or molding any one of mixtures a heat dissipation resin of any one or more of organic-, inorganic- and ceramic-based materials with graphite.

3. The fused sheet for electromagnetic wave absorption/extinction and shielding of claim 1, wherein as the porous metal sheet, a sintered sheet prepared by heating copper-, tin-, zinc-, aluminum- or stainless-based metal powder having a particle size of 1 μm-200 μm at a temperature lower than a melting temperature by 10-30% to be sintered, which is then pressed, is used.

4. The fused sheet for electromagnetic wave absorption/extinction and shielding of claim 1, wherein the porous metal sheet is a metal electrolysis cast sheet prepared by immersing a molding frame formed of a resin vaporized or liquefied at a high temperature in an electrolysis cast solution to be current applied, so as to electrodeposit a metal to form an electrodeposited layer, and heating the molding frame having this electrodeposited layer formed thereon to remove the resin.

5. The fused sheet for electromagnetic wave absorption/extinction and shielding of claim 1, wherein the porous metal sheet is a sheet member formed by forming pores on a thin plate formed of a copper-, tin-, zinc-, aluminum- or stainless-based metal material by a punching, laser or etching method, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding.

6. The fused sheet for electromagnetic wave absorption/extinction and shielding of claim 1, wherein the porous metal sheet is a net sheet formed by weaving warp wires and weft wires formed of a metal material having a circular section to be intercrossed.

7. The fused sheet for electromagnetic wave absorption/extinction and shielding of claim 1, further comprising a heat dissipation film layer formed of metal and organic/inorganic-based resin, which is integrally attached on the other surface of the porous metal sheet to which the graphite sheet is not attached, by pressing, application or impregnation, and a portion of which is impregnated through the pores formed on the surface of the porous metal sheet into the graphite sheet on the opposite surface of the porous metal sheet, and bound thereto, in which the heat dissipation film layer is formed by stacking any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by attaching a thin plate of aluminum or aluminum alloy.

8. A fused sheet for electronic equipment high heat dissipation, comprising:
   a premolded graphite sheet prepared by molding a graphite substrate including graphite into a sheet form, wherein the premolded graphite sheet has a density in a range of 0.1-1.5 g/cm$^3$; and
   a porous metal sheet having a plurality of pores including fine holes or gaps and having a size of 0.001 mm-0.05 mm connected to upper and lower surfaces of the porous metal sheet, wherein the premolded graphite sheet is stacked on one surface of the porous metal sheet, and press molded such that a portion of crystal particles of the graphite substrate is impregnated into the plurality of pores to be physically attached and combined to the plurality of pores, so as to have a density of 2.0 g/cm$^3$-6.0 g/cm$^3$.

9. The fused sheet for electronic equipment high heat dissipation of claim 8, further comprising a heat dissipation film layer formed of metal and organic/inorganic-based resin, which is integrally attached on the other surface of the porous metal sheet to which the graphite sheet is not attached, by pressing, application or impregnation, and a portion of which is impregnated through the pores formed on the surface of the porous metal sheet into the graphite sheet on the opposite surface of the porous metal sheet, and bound thereto.

10. The fused sheet for electronic equipment high heat dissipation of claim 9, wherein the heat dissipation film layer is formed by stacking any one or more of an insulating material formed by coating an insulation resin composition of any one or more of PVC, PC, urethane, silicone, ABS and UV, an adherend formed by applying a resin having an adhesive component, an adhesive material formed by attaching a double-sided tape, and a metal thin plate formed by attaching a thin plate of aluminum or aluminum alloy.

11. The fused sheet for electronic equipment high heat dissipation of claim 8, wherein the graphite sheet is prepared by compression molding graphite or graphite powder, using a graphite composition of any one of more of organic-, inorganic- and ceramic-based materials with graphite, or molding any one of mixtures a heat dissipation resin of any one or more of organic-, inorganic- and ceramic-based materials with graphite, the porous metal sheet, and as the porous metal sheet, a sintered sheet prepared by heating copper-, tin-, zinc-, aluminum- or stainless-based metal powder having a particle size of 1 μm-200 μm at a temperature lower than a melting temperature by 10-30% to be sintered, which is then pressed, is used.

12. The fused sheet for electronic equipment high heat dissipation of claim 8, wherein the porous metal sheet is a metal electrolyte cast sheet prepared by immersing a molding frame formed of a resin vaporized or liquefied at a high temperature in an electrolysis cast solution to be current applied, thereby electrodepositing a metal to form an electrodeposited layer, and heating the molding frame having this electrodeposited layer formed thereon to remove the resin.

13. The fused sheet for electronic equipment high heat dissipation of claim 8, wherein the porous metal sheet is a sheet member formed by forming pores on a thin plate formed of a copper-, tin-, zinc-, aluminum- or stainless-based metal material by a punching, laser or etching method, in which based on one surface to which the premolded graphite sheet is attached, the pores include a curved portion forming a curved shape with the surface and an inclined portion where a diameter is gradually decreased from this curved portion to an interior, so that the crystal structure of the premolded graphite sheet is not broken in a state that the premolded graphite sheet is attached by press molding.

14. The fused sheet for electronic equipment high heat dissipation of claim 8, wherein the porous metal sheet is a net sheet formed by weaving warp wires and weft wires formed of a metal material having a circular section to be intercrossed.

* * * * *